(12) United States Patent  
Yamazawa et al.

(10) Patent No.: US 9,275,837 B2  
(45) Date of Patent: *Mar. 1, 2016

(54) PLASMA PROCESSING APPARATUS

(75) Inventors: Yohei Yamazawa, Yamanashi (JP); Naoki Matsumoto, Miyagai (JP); Masahide Iwasaki, Hyogo (JP); Naohiko Okunishi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 747 days.

This patent is subject to a terminal disclaimer.

(21) Appl. No.: 12/951,380

(22) Filed: Nov. 22, 2010

(65) Prior Publication Data

US 2011/0126765 A1 Jun. 2, 2011

Related U.S. Application Data

(60) Provisional application No. 61/296,285, filed on Jan. 19, 2010.

(30) Foreign Application Priority Data

Nov. 24, 2009 (JP) ................................. 2009-265881

(51) Int. Cl.
 *H01J 37/32* (2006.01)
 *H05H 1/46* (2006.01)

(52) U.S. Cl.
 CPC ..... *H01J 37/32174* (2013.01); *H01J 37/32091* (2013.01); *H01J 37/32522* (2013.01); *H05H 1/46* (2013.01)

(58) Field of Classification Search
 CPC ... C23C 16/509; H05H 1/46; H01J 37/32091; H01J 37/32137; H01J 37/32155; H01J 37/32165; H01J 37/32174; H01J 37/32183; H01J 37/32522; H01J 37/32577
 USPC .......................... 118/715, 722, 723 R, 723 E; 156/345.43–345.47; 315/111.21
 See application file for complete search history.

(56) References Cited

U.S. PATENT DOCUMENTS 3,743,966 A * 7/1973 Grace et al. .................... 331/101  
3,936,776 A * 2/1976 Sundquist ...................... 333/202  
6,476,689 B1 * 11/2002 Uchida et al. .................. 333/177

(Continued)

FOREIGN PATENT DOCUMENTS

CN 101437354 A 5/2009  
CN 101546698 A 9/2009

(Continued)

*Primary Examiner* — Karla Moore  
*Assistant Examiner* — Benjamin Kendall  
(74) *Attorney, Agent, or Firm* — Pearne & Gordon LLP

(57) ABSTRACT

A parallel resonance frequency can be adjusted in order to stably and securely block different high frequency noises flowing into a line such as a power feed line or a signal line from electric members including a high frequency electrode within a processing chamber. A filter 102(1) coaxially accommodates a coil 104(1) within a cylindrical outer conductor 110, and a ring member 122 is coaxially installed between the coil 104(1) and the outer conductor 110. The ring-shaped member 122 may be a plate body of a circular ring shape on a plane orthogonal to an axial direction of the outer conductor 110 and made of a conductor such as cupper or aluminum and electrically connected with the outer conductor 110 while electrically insulated from the coil 104(1).

8 Claims, 25 Drawing Sheets

(56) References Cited

U.S. PATENT DOCUMENTS

| | | | |
|---|---|---|---|
| 8,398,815 B2* | 3/2013 | Yamazawa et al. | 156/345.44 |
| 2007/0181254 A1* | 8/2007 | Iida et al. | 156/345.28 |
| 2007/0284344 A1* | 12/2007 | Todorov et al. | 219/121.54 |
| 2008/0197780 A1* | 8/2008 | Yamazawa | 315/111.21 |
| 2009/0133839 A1 | 5/2009 | Yamazawa et al. | |
| 2009/0242132 A1 | 10/2009 | Sato | |
| 2011/0023780 A1* | 2/2011 | Ramaswamy et al. | 118/708 |

FOREIGN PATENT DOCUMENTS

| | | |
|---|---|---|
| JP | 2006-286733 A | 10/2006 |
| JP | 2008-198902 A | 8/2008 |
| JP | 2009-123505 A1 | 6/2009 |
| WO | 2009/113442 A1 | 9/2009 |

* cited by examiner (a)　　　　　　　　　　(b)

PLASMA PROCESSING APPARATUS

CROSS-REFERENCE TO RELATED APPLICATION

This application claims the benefit of Japanese Patent Application No. 2009-265881 filed on Nov. 24, 2009, and U.S. Provisional Application Ser. No. 61/296,285 filed on Jan. 19, 2010, the entire disclosures of which are incorporated herein by reference.

FIELD OF THE INVENTION

The present disclosure relates to a plasma processing apparatus for performing a plasma process on a processing target object by using a high frequency power, and more particularly, to a plasma processing apparatus including a filter for blocking a high frequency noise flowing into a line such as a power feed line or a signal line from an electric member such as a high frequency electrode within a processing chamber.

BACKGROUND OF THE INVENTION

In microprocessing for manufacturing a semiconductor device or a FPD (Flat Panel Display) using plasma, it is important to control a temperature and a temperature distribution of a substrate as well as a plasma density distribution on a processing target substrate (a semiconductor wafer, a glass substrate or the like). If the temperature control of a substrate is not appropriately performed, uniformity of a reaction on a substrate surface and uniformity of process characteristics may not be secured, resulting in deterioration of a production yield of semiconductor devices or display devices.

Generally, a mounting table or susceptor for mounting thereon a processing target substrate within a chamber of a plasma processing apparatus (especially, a capacitively coupled plasma processing apparatus) has a function as a high frequency electrode for applying a high frequency power into a plasma space; a function as a holder for holding the substrate by electrostatic attraction or the like; and a function as a temperature controller for controlling the substrate at a preset temperature by heat transfer. For the temperature control function, it is required to appropriately adjust a distribution of heat transfer characteristics on the substrate which is dependent on non-uniformity of radiation heat from plasma or a chamber wall or to appropriately adjust a heat distribution which is dependent on a substrate supporting structure.

Conventionally, in order to control a temperature of a top surface of a susceptor (and a temperature of a substrate), there has been widely used a method for forming a coolant passage through which a coolant flows in the susceptor or in a susceptor supporting table and supplying a temperature-controlled coolant into the coolant passage by a chiller device (see, for example, Patent Document 1). However, in this method of using such a chiller mechanism, it has been difficult to rapidly change a temperature of the coolant. Further, since responsiveness in temperature control is low, a temperature variation, a temperature increase or a temperature decrease may not be performed at a high speed.

Recently, in a plasma process, e.g., in a plasma etching process, it is required to successively form multilayer films on a processing target substrate through multi-steps within a single chamber instead of using a conventional method of using multiple chambers. To perform consecutive processes in the single chamber, a temperature of the mounting table needs to be rapidly increased and decreased. In this regard, there has been considered using a heater mechanism capable of accurately controlling a susceptor temperature and a substrate temperature at a high speed by controlling Joule heat generated by a heating member that is installed in a susceptor and generates heat by a power applied thereto.

Meanwhile, in case that a lower electrode high-frequency application type in which a high frequency power supply is connected to the susceptor (lower electrode) is used for a plasma control and, at the same time, the heater mechanism in which the heating member is embedded in the susceptor is used for a temperature control, a part of a high frequency power applied to the susceptor from the high frequency power supply may reach a heater power supply as a noise via the heating member and a heater power feed line, resulting in deterioration of an operation and a performance of the heater power supply. Especially, a high-speed heater power supply capable of being controlled at a high speed performs a switching control or an ON/OFF control with high sensitivity by using a semiconductor switching device such as a SSR (Solid State Relay). Therefore, if a high frequency noise is introduced therein, the heater may suffer an operation failure.

Typically, to prevent this problem, a filter for attenuating or blocking an undesired high frequency noise has been provided on the heater power feed line. This kind of filter needs to have a function of efficiently passing a high current from the heater power supply to the heating member of the susceptor while blocking a passage of a high frequency noise entering the power feed line via the heating member, that is, preventing the high frequency noise from entering the heater power supply by providing a sufficiently high impedance to the high frequency noise, thereby protecting the heater power supply from the high frequency noise and stabilizing plasma within the chamber.

The inventors of the present disclosure have proposed, in Patent Document 2, a plasma processing apparatus in which an air core coil having a sufficiently large inductance is provided in a primary stage of this kind of filter and this air core coil is accommodated within a conductive case installed in the vicinity of a susceptor (typically, below the susceptor).

Patent Document 1: Japanese Patent Laid-Open Publication No. 2006-286733

Patent Document 2: Japanese Patent Laid-Open Publication No. 2008-198902

In the plasma processing apparatus disclosed in Patent Document 2, when a single high frequency power, particularly, a single frequency power of about 13.56 MHz or below is applied to the susceptor (lower electrode), the filter including the air core coil configured as described above may function effectively. Accordingly, a high frequency noise less than about 13.56 MHz can be blocked efficiently and stably on the heater power feed line while a high heater current equal to or greater than about 30 A is allowed to flow in the heater power feed line.

However, it was found out that in case of employing a lower electrode dual frequency application type in which both a high frequency power of a relatively low frequency (typically, about 13.56 MHz or less) for ion attraction and a high frequency power of a relatively high frequency (typically, about 27 MHz or more) for plasma generation are applied to the susceptor, it is difficult to stably and securely block the high frequency noise having a relatively high frequency by using the filter having the above-described configuration. To be specific, if the frequency of the high frequency power for plasma generation is increased (typically, if it is set to be about 60 MHz or higher) in order to obtain high density plasma under a low pressure, an impedance characteristic of the filter for such a high frequency range may become non-uniform. The non-uniformity of the filter characteristic may have adverse effect on reliability and reproducibility of a plasma process, and, thus, a difference in process performance may be caused in a plasma processing apparatus for mass production.

Further, in order to apply high impedance to all of multiple frequencies, a conventional general filter has a configuration in which a plurality of LC parallel resonance circuits having different parallel resonance frequencies is connected in series. With this filter configuration, however, an impedance characteristic may be changed complicatedly because of self-resonance of a coil included in each LC parallel resonance circuit or a mutual interference between the adjacent LC parallel resonance circuits. As a result, reliability and reproducibility of plasma process may be lowered.

BRIEF SUMMARY OF THE INVENTION

The present inventors have conducted many experiments and researches to solve the foregoing problems and finally derived the present disclosure.

The present disclosure provides a plasma processing apparatus capable of improving reliability and reproducibility of a plasma process by efficiently, stably and securely blocking a high frequency noise, (especially, a plurality of high frequency noises having different frequencies) flowing into a line such as a power feed line or a signal line from electric members including a high frequency electrode within a processing chamber.

Further, the present disclosure also provides a plasma processing apparatus including a filter having high stability and reproducibility of an impedance characteristic such as multiple parallel resonance and capable of adjusting a parallel resonance frequency in order to block a high frequency noise flowing into a line such as a power feed line or a signal line from electric members including a high frequency electrode within a processing chamber.

In accordance with a first aspect of the present disclosure, there is provided a plasma processing apparatus including: a processing chamber that performs a plasma process therein; a high frequency electrode installed within the processing chamber and having therein a heating member; a high frequency power supply electrically connected with the high frequency electrode; and a filter that is installed on a power feed line for electrically connecting the heating member with a heater power supply and attenuates or blocks a high frequency noise entering the power feed line via the heating member. Here, the filter may include a single coil that forms a part of the power feed line; and a tube-shaped outer conductor that accommodates or surrounds the coil and forms a distributed constant line having a constant characteristic impedance in pair with the coil. Further, parallel resonance may occur in the distributed constant line at regular multiple resonance frequencies depending on a winding length of the coil. Furthermore, one of the multiple resonance frequencies may be equal to or approximate to a frequency of the high frequency noise so that the distributed constant line may provide sufficiently high impedance for the high frequency noise.

In accordance with the plasma processing apparatus of the first aspect, in the filter on the power feed line, the distributed constant line is formed between the single air core coil and the tube-shaped outer conductor that accommodates or surrounds the coil. Parallel resonance occurs in the distributed constant line at regular multiple frequencies depending on a winding length of the air core coil, and a highly stable and reproducible impedance characteristic may be obtained. Accordingly, by setting one of the parallel resonance frequencies to be equal to or approximate to a frequency of the high frequency noise to be blocked, the distributed constant line can provide sufficiently high impedance for the high frequency noise. Therefore, the power feed circuit may be securely protected, and reproducibility and reliability of the plasma process may be improved.

In accordance with a second aspect of the present disclosure, there is provided a plasma processing apparatus including: a processing chamber that performs a plasma process therein; a first electrode that is installed within the processing chamber and mounts thereon a processing target object; a second electrode installed within the processing chamber so as to face the first electrode; a first high frequency power supply that is electrically connected with the first electrode and outputs a first high frequency power; a second high frequency power supply that is electrically connected with the first or second electrode and outputs a second high frequency power; and a filter that is installed on a power feed line for electrically connecting a heating member installed in the first electrode with a heater power supply and attenuates or blocks a high frequency noise entering the power feed line via the heating member. Here, the filter may include a single coil that forms a part of the power feed line; and a tube-shaped outer conductor that accommodates or surrounds the coil and forms a distributed constant line having a constant characteristic impedance in pair with the coil. Further, parallel resonance may occur in the distributed constant line at regular multiple resonance frequencies depending on a winding length of the coil. Furthermore, one of the multiple resonance frequencies may be equal to or approximate to a frequency of the high frequency noise so that the distributed constant line may provide sufficiently high impedance for the high frequency noise.

In accordance with the plasma processing apparatus of the second aspect, in the filter on the power feed line, the distributed constant line is formed between the single air core coil and the tube-shaped outer conductor that accommodates or surrounds the coil. Parallel resonance occurs in the distributed constant line at regular multiple frequencies depending on a winding length of the air core coil, and a highly stable and reproducible impedance characteristic may be obtained. Accordingly, by setting one of the parallel resonance frequencies to be equal to or approximate to a frequency of the high frequency noise to be blocked (typically, a frequency of the first high frequency power or the second high frequency power), the distributed constant line can provide sufficiently high impedance for the high frequency noise. Therefore, the power feed circuit may be securely protected, and reproducibility and reliability of the plasma process may be improved.

In accordance with one embodiment of the present disclosure, the second high frequency power may mainly contribute to generating plasma of a processing gas within the processing chamber, and the first high frequency power may mainly contribute to attracting ions from the plasma into the processing target object mounted on the first electrode.

Furthermore, in accordance with one embodiment of the present disclosure, the power feed line may include a first power conducting wire and a second power conducting wire coupled to both ends of the heating member, respectively, and the coil of the filter may include a first coil that forms a part of the first conducting wire and a second coil that forms a part of the second power conducting wire. Inside the outer conductor, a first coil conducting wire that forms the first coil and a second coil conducting wire that forms the second coil may be alternately wound in a spiral shape in approximately same winding lengths. With this configuration, two filters commonly have a single outer conductor, and a RF power loss of the filters and non-uniformity (fluctuation) may be reduced.

In accordance with a third aspect of the present disclosure, there is provided a plasma processing apparatus including: a processing chamber that performs a plasma process therein; a high frequency electrode installed within the processing chamber and having therein a heating member; a high frequency power supply electrically connected with the high frequency electrode; and a filter that is installed on a power feed line for electrically connecting the heating member with a heater power supply and attenuates or blocks a high frequency noise entering the power feed line via the heating member. Here, the filter may include a single coil that forms a part of the power feed line; a tube-shaped outer conductor that accommodates or surrounds the coil and forms a distributed constant line, in which parallel resonance occurs at multiple resonance frequencies, in pair with the coil; and a parallel resonance frequency controller that adjusts at least one of the multiple resonance frequencies. Further, one of the multiple resonance frequencies may be equal to or approximate to a frequency of the high frequency noise so that the distributed constant line may provide sufficiently high impedance for the high frequency noise.

In accordance with a fourth aspect of the present disclosure, there is provided a plasma processing apparatus including: a processing chamber that performs a plasma process therein; a first electrode that is installed within the processing chamber and mounts thereon a processing target object; a second electrode installed within the processing chamber so as to face the first electrode; a first high frequency power supply that is electrically connected with the first electrode and outputs a first high frequency power; a second high frequency power supply that is electrically connected with the first or second electrode and outputs a second high frequency power; and a filter that is installed on a power feed line for electrically connecting a heating member installed in the first electrode with a heater power supply and attenuates or blocks a high frequency noise entering the power feed line via the heating member. Here, the filter may include a single coil that forms a part of the power feed line; a tube-shaped outer conductor that accommodates or surrounds the coil and forms a distributed constant line, in which parallel resonance occurs at multiple resonance frequencies, in pair with the coil; and a parallel resonance frequency controller that adjusts at least one of the multiple resonance frequencies. Further, one of the multiple resonance frequencies may be equal to or approximate to a frequency of the high frequency noise so that the distributed constant line may provide sufficiently high impedance for the high frequency noise.

In accordance with the plasma processing apparatuses of the third and fourth aspects, in the filter on the power feed line, the distributed constant line is formed between the single air core coil and the tube-shaped outer conductor that accommodates or surrounds the coil. The distributed constant line has impedance characteristic of forming parallel resonance at regular multiple resonance frequencies. By the parallel resonance frequency controller, one of the parallel resonance frequencies is set to be equal to or approximate to a frequency of the high frequency noise to be blocked, so that the distributed constant line can provide sufficiently high impedance for the high frequency noise. Therefore, the power feed circuit may be securely protected, and reproducibility and reliability of the plasma process may be improved.

In accordance with one embodiment of the present disclosure, the characteristic impedance varying member may include a ring-shaped member installed coaxially with the coil inside the outer conductor. In one embodiment, the ring-shaped member may be made of a conductor, and the ring-shaped member may be electrically connected with one of the outer conductor and the coil while electrically insulated from the other one of the outer conductor and the coil. Alternatively, the ring-shaped member may be made of a dielectric such as resin.

In one embodiment, the ring-shaped member may be a plate body of a circular ring shape on a plane orthogonal to an axial direction of the outer conductor. In one embodiment, the plasma processing apparatus may include a ring-shaped member position controller that controls a position of the ring-shaped member relative to the coil in an axial direction of the outer conductor.

Furthermore, in accordance with one embodiment of the present disclosure, when viewed from the processing chamber, the air core coil may be installed on an entrance side of the filter, and an output terminal of the air core coil may be electrically connected with a conductive member of a ground potential via a capacitor. In this case, the capacitor may become substantially short-circuited in the high frequency band when viewed from the output terminal side of the air core coil. Accordingly, an output terminal of the distributed constant circuit may become short-circuited. The outer conductor may be electrically grounded.

In accordance with a fifth aspect of the present disclosure, there is provided a plasma processing apparatus for applying, from a high frequency power supply via a power feed rod, a high frequency power to a high frequency electrode within a processing chamber that performs a plasma process, the apparatus including: a tube-shaped outer conductor that surrounds the power feed rod and forms a distributed constant line in pair with the power feed rod; and one or more characteristic impedance varying members that are provided between the power feed rod and the outer conductor and cause a partial change in a characteristic impedance of the distributed constant line at respective positions thereof such that an impedance characteristic of the distributed constant line allows sufficiently high impedance to be applied to a high frequency noise entering the power feed rod from the high frequency electrode.

In accordance with the plasma processing apparatus of the fifth aspects, on the high frequency power feed line, the distributed constant line is formed between the power feed rod and the outer conductor. The distributed constant line has impedance characteristic of forming parallel resonance at regular multiple resonance frequencies. By the characteristic impedance varying members, one of the parallel resonance frequencies is set to be equal to or approximate to a frequency of the high frequency noise to be blocked, so that the distributed constant line can provide sufficiently high impedance for the high frequency noise. Therefore, the power feed circuit may be securely protected, and reproducibility and reliability of the plasma process may be improved.

In accordance with a sixth aspect of the present disclosure, there is provided a plasma processing apparatus including: a processing chamber that performs a plasma process therein; an external circuit of a signal system or a power system that is electrically connected with an electric member within the processing chamber via a line; and a filter installed on the line to attenuate or block a high frequency noise entering the line from the electric member toward the external circuit. Here, the filter may include a first conductor configured as a one path of the line and extended to have a constant spatial profile in a constant axial direction; a tube-shaped second conductor that accommodates or surrounds the first conductor and forms a distributed constant line having a constant characteristic impedance in pair with the first conductor. Further, parallel resonance may occur in the distributed constant line at regular multiple resonance frequencies depending on a length of the first or second conductor. Furthermore, one of the multiple resonance frequencies may be equal to or approximate to a frequency of the high frequency noise so that the distributed constant line may provide sufficiently high impedance for the high frequency noise.

In accordance with the plasma processing apparatus of the sixth aspect, in the filter provided on the line that connects the external circuit of the signal system or the power system with the electric member within the processing chamber that performs the plasma process therein, the distributed constant line is formed between the first conductor and the tube-shaped second conductor that accommodates or surrounds the first conductor. Parallel resonance occurs in the distributed constant line at regular multiple resonance frequencies depending on a length of the first or second conductor, and a highly stable and reproducible impedance characteristic may be obtained. Further, one of the parallel resonance frequencies is set to be equal to or approximate to a frequency of the high frequency noise to be blocked, so that the distributed constant line can provide sufficiently high impedance for the high frequency noise. Therefore, the power feed circuit may be securely protected, and reproducibility and reliability of the plasma process may be improved.

In accordance with a seventh aspect of the present disclosure, there is provided a plasma processing apparatus including: a processing chamber that performs a plasma process therein; an external circuit of a signal system or a power system that is electrically connected with an electric member within the processing chamber via a line; and a filter installed on the line to attenuate or block a high frequency noise entering the line from the electric member toward the external circuit. Here, the filter may include a first conductor configured as a one path of the line and extended to have a constant spatial profile in a constant axial direction; a tube-shaped second conductor that accommodates or surrounds the first conductor and forms a distributed constant line, in which parallel resonance occurs at multiple resonance frequencies, in pair with the first conductor; and a parallel resonance frequency controller that adjusts at least one of the multiple resonance frequencies. Further, one of the multiple resonance frequencies may be equal to or approximate to a frequency of the high frequency noise so that the distributed constant line may provide sufficiently high impedance for the high frequency noise.

In accordance with the plasma processing apparatus of the seventh aspect, in the filter provided on the line that connects the external circuit of the signal system or the power system with the electric member within the processing chamber that performs the plasma process therein, the distributed constant line is formed between the first conductor and the tube-shaped second conductor that accommodates or surrounds the first conductor. The distributed constant line has impedance characteristic of forming parallel resonance at regular multiple resonance frequencies. By the parallel resonance frequency controller, one of the parallel resonance frequencies is set to be equal to or approximate to a frequency of the high frequency noise to be blocked, so that the distributed constant line can provide sufficiently high impedance for the high frequency noise. Therefore, the power feed circuit may be securely protected, and reproducibility and reliability of the plasma process may be improved In accordance with the plasma processing apparatus of the present disclosure, with the configuration and operation as described above, reliability and reproducibility of the plasma process can be improved by efficiently, stably and securely blocking a high frequency noise (especially, a plurality of high frequency noises having different frequencies) flowing into a line such as a power feed line or a signal line from electric members including a high frequency electrode within a processing chamber. Further, a high frequency blocking function can be improved by adjusting the parallel resonance frequency.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Hereinafter, the embodiments of the present disclosure will be described with reference to the accompanying drawings.

Figure 1:
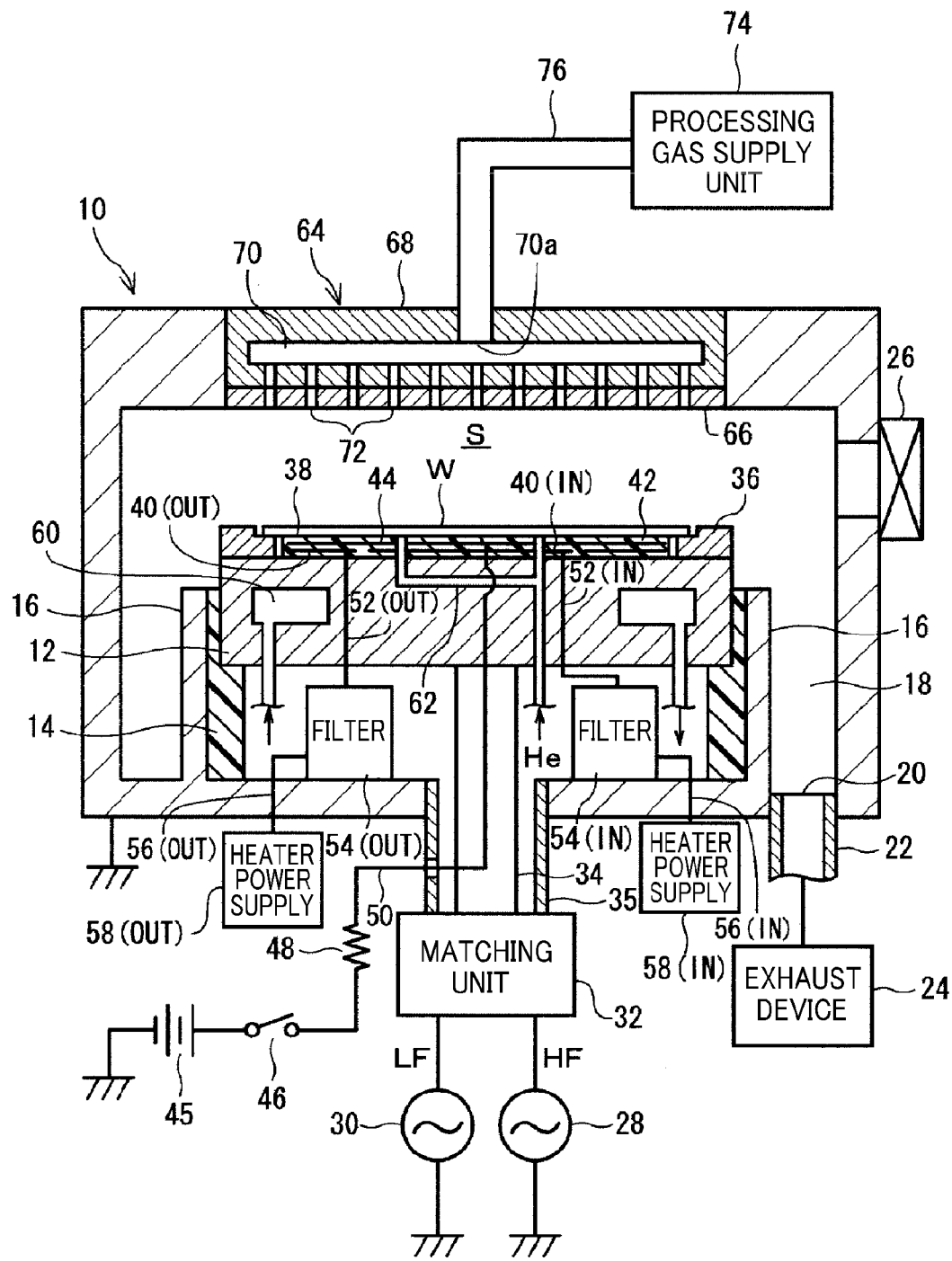
FIG. 1 is a longitudinal cross sectional view illustrating a configuration of a plasma processing apparatus in accordance with an embodiment of the present disclosure.

FIG. 1 illustrates a configuration of a plasma processing apparatus in accordance with an embodiment of the present disclosure. The plasma processing apparatus may be configured as a capacitively coupled plasma etching apparatus of a lower electrode dual frequency application type. For example, the plasma processing apparatus has a cylindrical chamber (processing vessel) 10 made of a metal such as aluminum or stainless steel. The chamber 10 is frame-grounded.

A circular plate-shaped susceptor 12 for mounting thereon a target object such as a semiconductor wafer W is horizontally provided in the chamber 10 and serves as a lower electrode. The susceptor 12 is made of, i.e., aluminum, and is supported, without being grounded, an insulating cylindrical support 14 vertically extended upward from the bottom of the chamber 10. An ring-shaped exhaust path 18 is formed along an outer circumference of the insulating cylindrical support 14 between an inner wall of the chamber 10 and a conductive cylindrical support 16 vertically extended upward from the bottom of the chamber 10. An exhaust port 20 is provided at the bottom portion of the exhaust path 18. Further, an exhaust device 24 is connected with the exhaust port 20 via an exhaust pipe 22. The exhaust device 24 has a vacuum pump such as a turbo-molecular pump to depressurize a processing space within the chamber 10 to a desired vacuum level. Installed at a sidewall of the chamber 10 is a gate valve 26 for opening or closing a loading/unloading port of the semiconductor wafer W.

The susceptor 12 is electrically connected with a first and a second high frequency power supply 28 and 30 via a matching unit 32 and a power feed rod 34. Here, the first high frequency power supply 28 outputs a first high frequency power HF (generally, i.e., about 27 MHZ or more, desirably, about 60 MHz or more) for plasma generation. Meanwhile, the second high frequency power supply 30 outputs a second high frequency power LF (generally, i.e., about 13.56 MHZ or below) for ion attraction to the semiconductor wafer W on the susceptor 12. The matching unit 32 includes a first and a second matching device (not shown) for performing an impedance matching between the first and second high frequency power supply 28 and 30 and a plasma load.

The power feed rod 34 is made of a cylindrical or circular column-shaped conductor having an outer diameter. An upper end of the power feed rod 34 is connected to a central portion of a bottom surface of the susceptor 12, and a lower end of the power feed rod 34 is connected to high frequency output terminals of the first and second matching devices within the matching unit 32. Further, a cylindrical conductor cover is installed between the matching unit 32 and the bottom surface of the chamber 10 to surround the power feed rod 34. To be more specific, a circular opening having a predetermined diameter slightly larger than an outer diameter of the power feed rod 34 is formed in the bottom surface (lower surface) of the chamber 10. Further, the upper end of the conductor cover 35 is connected to the opening of the chamber, while a lower end of the conductor cover 35 is connected to a ground (retrace) terminal of the matching device.

The susceptor 12 has a slightly larger diameter than that of the semiconductor wafer W. A top surface of the susceptor 12 is divided into a central portion, i.e., wafer mounting portion, which is of substantially the same size and of substantially the same shape (circular shape) as those of the wafer W, and a ring-shaped peripheral portion extending from an outer periphery of the wafer mounting portion. The semiconductor wafer W to be processed is mounted on the wafer mounting portion. A ring-shaped focus ring 36 having an inner diameter larger than a diameter of the semiconductor wafer W on the ring-shaped peripheral portion. The focus ring 36 is made of any one of, e.g., Si, SiC, C, $SiO_2$ depending on the etching target material of the semiconductor wafer W.

On the wafer mounting portion of the top surface of the susceptor 12, an electrostatic chuck 38 for the wafer attraction and the heating member 40 are provided. In the electrostatic chuck 38, a DC electrode 44 is embedded in a film- or plate-shaped dielectric member 42 and the electrostatic chuck 38 is integrally formed on and fixed to the susceptor 12's top surface as one body. The DC electrode 44 is electrically connected to an external DC power supply 45 placed outside the chamber 10 via a switch 46, a high resistance resistor and a DC high-voltage line 50. By applying a high DC voltage from the DC power supply 45 to the DC electrode 44, the semiconductor wafer W can be attracted to and held on the electrostatic chuck 38 by an electrostatic attracting force. Further, the DC high voltage line 50 is a coated wire, and the DC high voltage line 50 passes through a lower portion of the cylindrical power feed rod 34; penetrating the susceptor 12 from a bottom surface thereof; and connected to the DC electrode 44 of the electrostatic chuck 38.

Figure 3:
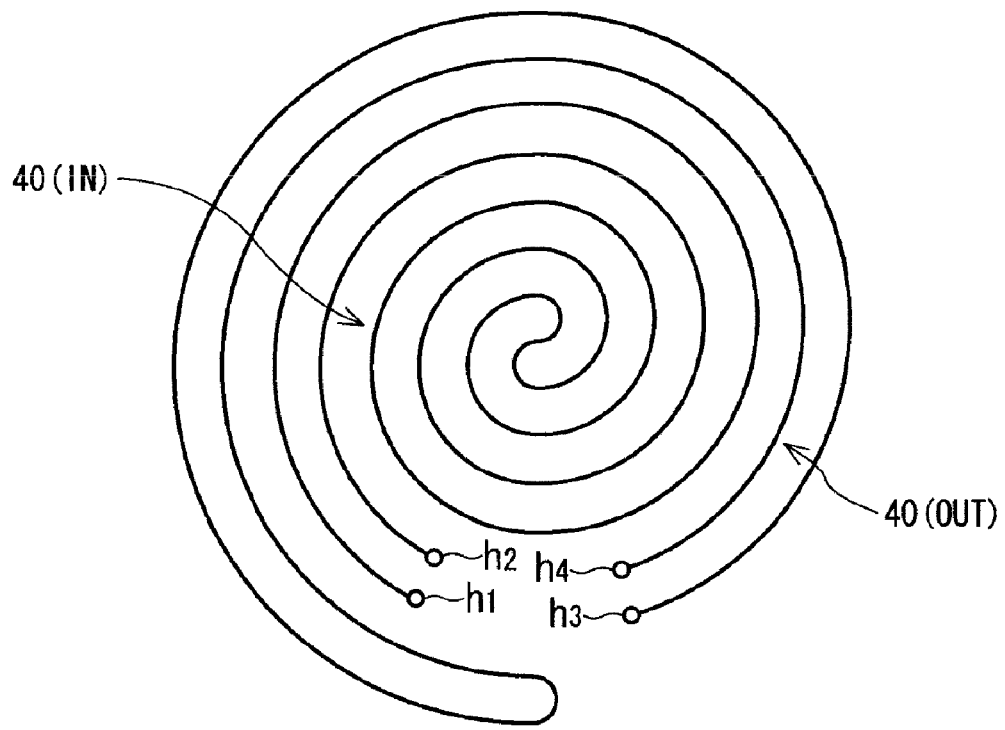
FIG. 3 illustrates an example configuration of the heating member in accordance with the embodiment of the present disclosure.

The heating member 40 is formed as, i.e., a spiral-shaped resistance heating wire embedded within the dielectric 42, together with the DC electrode 44 of the electrostatic chuck 38. In this embodiment, as shown in FIG. 3, the heating member 40 is divided into an inner heating wire 40(IN) and an outer heating wire 40(OUT) in a radial direction of the susceptor 12. The inner heating wire 40(IN) is electrically connected to a dedicated heater power supply 58(IN) placed outside the chamber 10 via an insulated power feed conductor 52(IN), a filter unit 54(IN), and an electrical cable 56(IN). The outer heating wire 40(OUT) is electrically connected to a dedicated heater power supply 58(OUT) placed outside the chamber 10 via an insulated power feed conductor 52(OUT), a filter unit 54(OUT), and an electrical cable 56(OUT). The filter units 54(IN) and 54(OUT) are main components of this embodiment, and an internal configuration and operation of the filter unit 54 will be described later in detail.

In the susceptor 12 is installed a ring-shaped coolant room or a coolant path 60 extending in, e.g., a circumferential direction. In the coolant room 60, coolant of a predetermined temperature, i.e., cooling water is supplied and circulated from a chiller unit (not shown) via a coolant supply pipe. A temperature of the susceptor 12 may be controlled to be decreased by a temperature of the coolant. Moreover, in order to thermally adhere the semiconductor wafer W to the susceptor 12, a heat transfer gas, e.g., He gas, from a heat transfer gas supply unit (not shown) is supplied to a contact interface between the electrostatic chuck 38 and the semiconductor wafer W via the gas supply pipe and a gas passage 62 within the susceptor 12.

A shower head 64 serving as the upper electrode facing the susceptor 12 parallel to each other is installed at the ceiling of the chamber 10. The shower head 64 includes an electrode plate 66 facing the susceptor 12, and an electrode support 68 for detachably supporting the electrode plate 66 from its back (top) side. A gas chamber 70 is provided in the inside of the electrode support 68 and a plurality of gas discharge holes 72 is formed in the electrode support 68 and the electrode plate 66 toward the susceptor 12 from the gas room 70. A space S between the electrode plate 66 and the susceptor 12 serves as a plasma generation space and a processing space. A gas inlet 70a formed at an upper part of the gas chamber 70 is connected with a processing gas supply unit 74 via a gas supply line 76. The electrode plate 66 is made of, e.g., Si, Sic or C, and the electrode support 68 is made of, e.g., alumite-treated aluminum.

For example, a apparatus controller having a microcomputer controls each operation of each unit of the plasma etching apparatus including the exhaust device 24, the high frequency power supplies 28 and 30, the switch 42 of the DC power supply 45, the heater power supplies 58(IN) and 58(OUT) the chiller unit (not illustrated), the heat transfer gas supply unit (not illustrated), and the processing gas supply unit 74 or controls an overall operation (sequence) of the plasma etching apparatus.

In the plasma etching apparatus, in order to perform an etching, the gate valve 26 is first opened and the semiconductor wafer W to be processed is loaded in the chamber 10 and mounted on the electrostatic chuck 38. Then, an etching gas (generally, a mixture gas) is introduced into the chamber 10 from the processing gas supply unit 74 at a predetermined flow rate, and an internal pressure of the chamber 10 is adjusted to a setting level by the exhaust unit 24. Further, by turning on the first and second high frequency power supplies 28, the first and second high frequency power HF and LF are outputted at a predetermined power level, respectively. These high frequency powers HF and LF are applied to the susceptor 12 (lower electrode) via the matching unit 32 and the power feed rod 34. Furthermore, the heat transfer gas supply unit supplies the heat transfer gas (He gas) into a contact interface between the electrostatic chuck 38 and the semiconductor wafer W, and by turn on the switch 46 for the electrostatic chuck 38, the heat transfer gas is confined in the contact interface by the electrostatic attracting force. At this time, by turning on the heater power supplies 58(IN) and 58(OUT), the inner and outer heating members 40(IN) and 40(OUT) are heated by joule heat, respectively. Therefore, a temperature or a temperature distribution on the top surface of the susceptor 12 is controlled to a setting value. The etching gas discharged from the shower head 64 is excited into plasma by a high frequency electric discharge between both electrodes 12 and 64. By radicals or ions generated from the plasma, an etching target film on the semiconductor wafer W's surface is etched in a desired pattern.

In the capacitively coupled plasma etching apparatus, by applying the first high frequency power HF of a relatively high frequency (desirably, about 60 MHz or more) for the plasma generation to the susceptor 12, it is possible to form the high density plasma in a desired dissociated state even under a low pressure condition. Simultaneously, in the capacitively coupled plasma etching apparatus, by applying the second high frequency power LF of a relatively low frequency (i.e., about 13.56 MHz or below) for ion attraction to the susceptor 12, and, thus, an anisotropic etching having a high selectivity can be performed on the semiconductor wafer W on the susceptor 12.

Further, in the capacitively coupled plasma etching apparatus, the cooling of chiller and the heating of heater are simultaneously applied to the susceptor 12, and the heating of heater is independently controlled in an edge portion and a central portion in a radial direction. Thus, the temperature can be changed, increased or decreased at a high speed and, also, a profile of temperature distribution can be variously controlled as desired.

Hereinafter, referring to FIGS. 2 to 22, configurations and operations of the filter units 54(IN) and 54(OUT) as the main components of the plasma etching apparatus will be explained.

Figure 2:
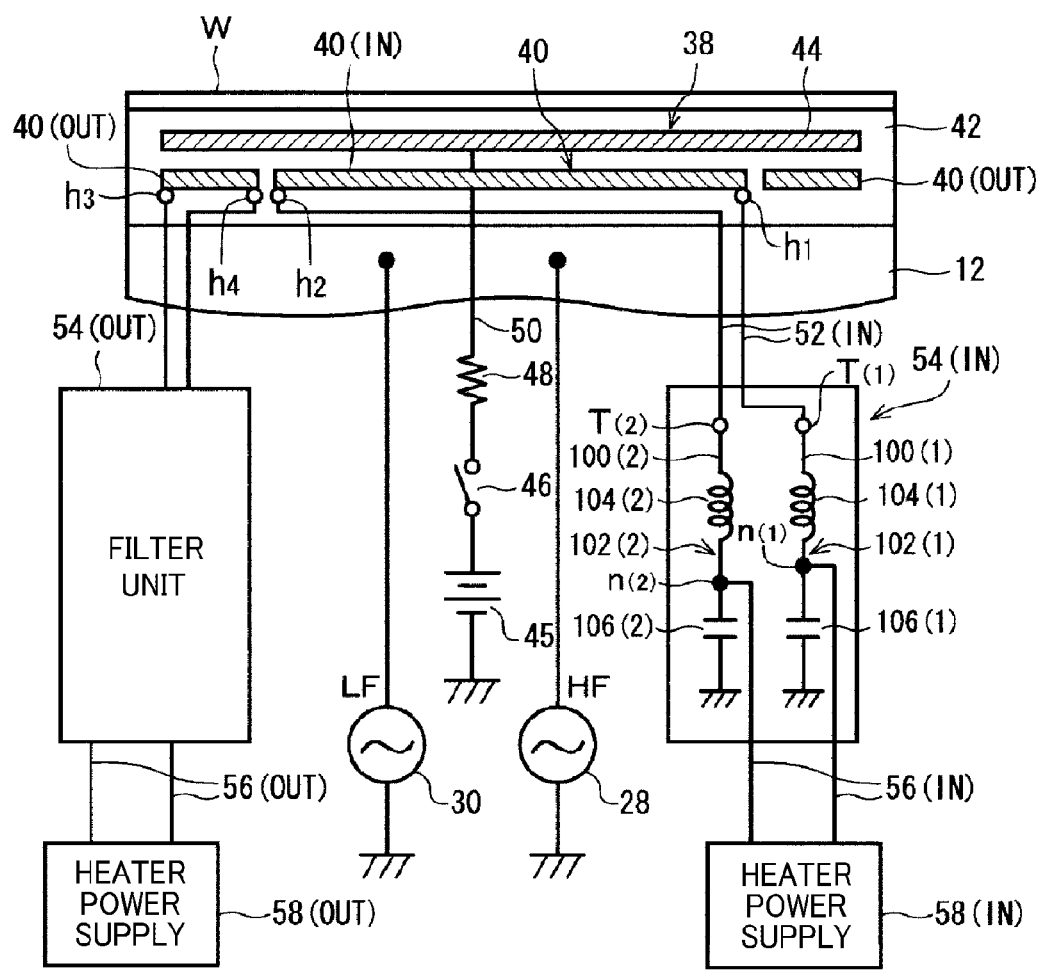
FIG. 2 illustrates a circuit configuration of a heater power feed unit for supplying electric power to a heating member of a susceptor in accordance with the embodiment of the present disclosure.

FIG. 2 illustrates a circuit configuration of the heater power feed unit for supplying a power to the heating member 40 embedded in the susceptor 12. In the embodiment, the respective inner heating wire 40(IN) and outer heating wire 40(OUT) of the heating member 40 are individually connected with the respective heater supply feed units having substantially the same circuit configuration to independently control the heating amount or heating temperature of the inner heating wire(IN) and outer heating wire 40(OUT). In the following description, the configuration and operation of one heater power feed unit connected with the inner heating wire 40(IN) will be described. Likewise, the configuration and operation of the other heater power feed unit connected with the outer heating wire 40(OUT) are completely the same as those of the one heater supply feed unit.

The heater power supply 58(IN) is an AC power supply for performing a switching operation ON/OFF of a commercial frequency by using, i.e., SSR, and is connected with the inner heating wire 40(IN) in a closed loop circuit. More specifically, in a pair of output terminals of the heater power supply 58(IN), a first output terminal is electrically connected to a first terminal $h_1$ of the inner heating wire 40(IN) via the first power feed line (i.e., a power supply line 100(1), and a second output terminal is electrically connected to a second terminal $h_2$ of the inner heating wire 40(IN) via a second power feed line (i.e., a power supply line) 100(2).

The filter unit 54 IN has a first filter 102(1) and a second filter 102(2) provided on a part of the first power feed line 100(1) and the second power feed line 100(2), respectively. The filters 102(1) and 102(2) have substantially the same circuit configuration.

To be more specific, the filter 102(1) (102(2)) is configured as a serial circuit of a coil 104(1) (104(2)) and a capacitor 106(1) (106(2)). One terminal of the coil 104(1) (104(2)), i.e., a filter terminal T(1) (T(2)) is each connected to a terminal h1 (h2) of the inner heating wire 40(IN) via one of a pair of power feed conductors 52(IN), and a capacitor 106(1) (106(2)) is connected between the other terminal of the coil 104(1) (104(2)) and a conductive member of ground potential (for example, the chamber 10). A connection point n(1) (n(2)) between the coil 104(1) (104(2)) and the capacitor 106(1) (106(2)) is connected to one of the first and second output terminals of the heater power 58(IN) via an electrical cable (a pair cable) 56(IN).

In the heater power feed unit having the configuration described above, during a cycle of positive polarity, the current output from the heater power supply 58(IN) flows from one terminal $h_1$ to the inner heating wire 40(IN) via the first power feed line 100(1), i.e., the electric cable 56(IN), the coil 104(1) and the power feed conductor 52(IN), and Joule heat is generated in the respective parts of the inner heating wire 40(IN) by the supplied current. After coming out of the other terminal $h_2$, the current returns via the second power feed line 100(2), i.e., the power feed conductor 52(IN), the coil 104(2) and the electric cable 56(IN). During a cycle of negative polarity, current flows in an opposite direction in the same circuit. Since the current of AC power of outputted from the heater power supply is has a commercial frequency, impedance or a voltage drop of the coil 104(1) and 104(2) is very small enough to neglect, and, also, a current leaking to the earth through the capacitor 106(1) or 106(2) is very small enough to neglect.

[First Experimental Example of Filter]

Figure 4:
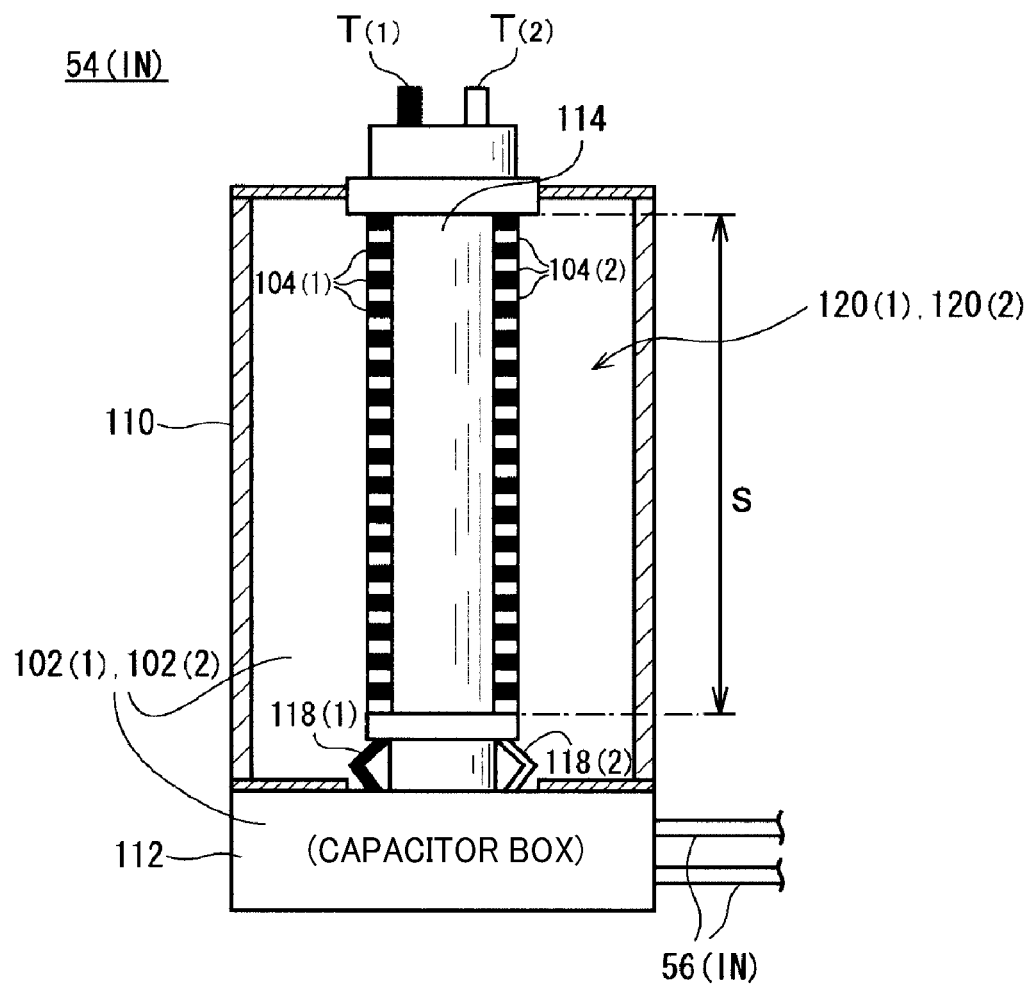
FIG. 4 is a longitudinal cross sectional view illustrating a structure of a filter unit in accordance with a first experimental example.
Figure 5:
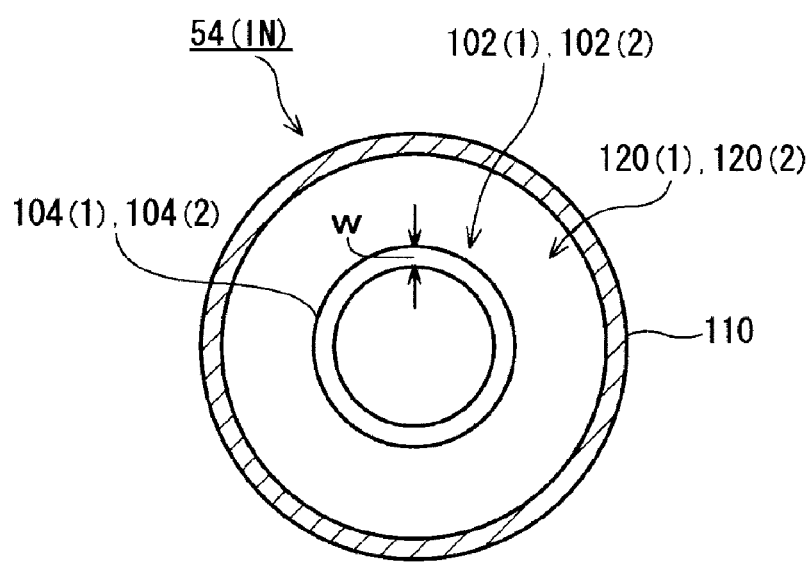
FIG. 5 is a transversal cross sectional view illustrating the structure of the filter unit in accordance with the first experimental example.

FIGS. 4 to 7 illustrate a physical structure of a filter unit 54(IN) in accordance with a first experimental example. In the filter unit 54(IN), as shown in FIGS. 4 and 5, a coil 104(1) of a first filter 102(1) and a coil 104(2) of a second filter 102(2) are coaxially provided within a cylindrical outer conductor 110 made of, e.g., aluminum. Further, on an opposite side of filter terminals T(1) and T(2), a capacitor 106(1) of the first filter 102(1) and a capacitor 106(2) of the second filter 102(2) are accommodated together within a capacitor box 112 made of, e.g., aluminum, as shown in FIG. 2. The outer conductor 110 is fixed to a conductive member of a ground potential, e.g., a chamber 10 by screws.

Each of the coils 104(1) and 104(2) may be an air core coil and has a function as a power feed line through which a sufficiently high current (e.g., about 30 A) flows from a heater power supply 58(IN) into an inner heating wire 40(IN). In addition, in order to obtain a very high inductance with an air core without using a magnetic core such as ferrite to suppress heat generation (power loss) and in order to obtain a long line length, each of the coils 104(1) and 104(2) has a thick coil wire and a coil size much larger than a conventional coil size (e.g., about 22 mm to about 45 mm in diameter and about 130 mm to about 250 mm in length).

In this experimental example, the coils 104(1) and 104(2) are concentrically installed on a cylindrical or circular column-shaped bobbin 114 made of an insulator such as resin and standing upright on the capacitor box 112 within the cylindrical outer conductor 110.

Figure 6:
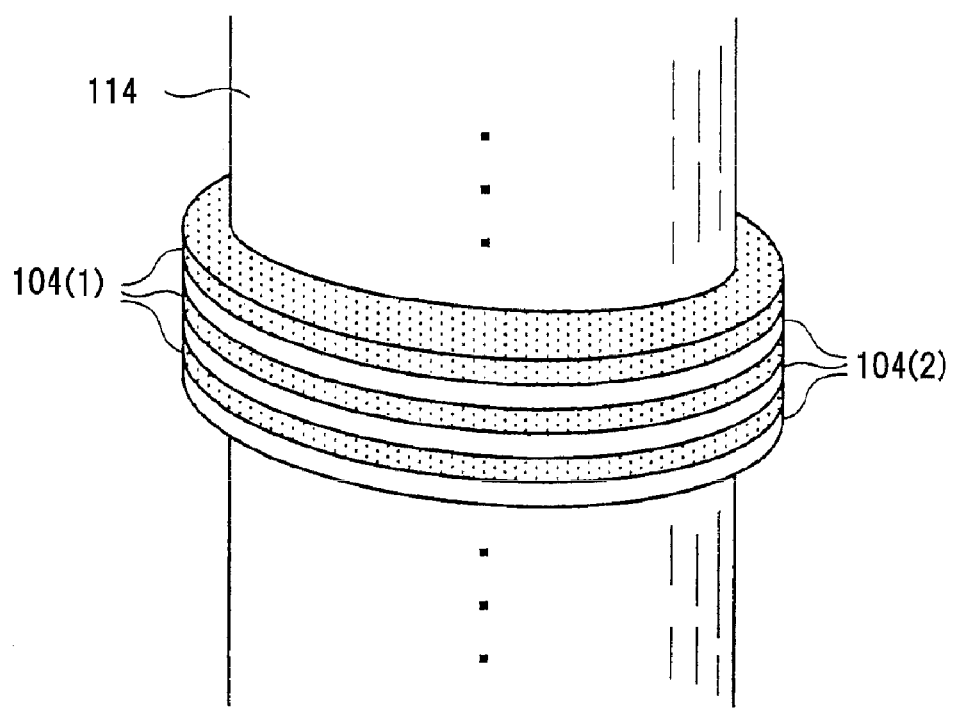
FIG. 6 is a perspective view illustrating a coil winding structure of two air core coils installed on a single bobbin in accordance with the embodiment of the present disclosure.
Figure 7:
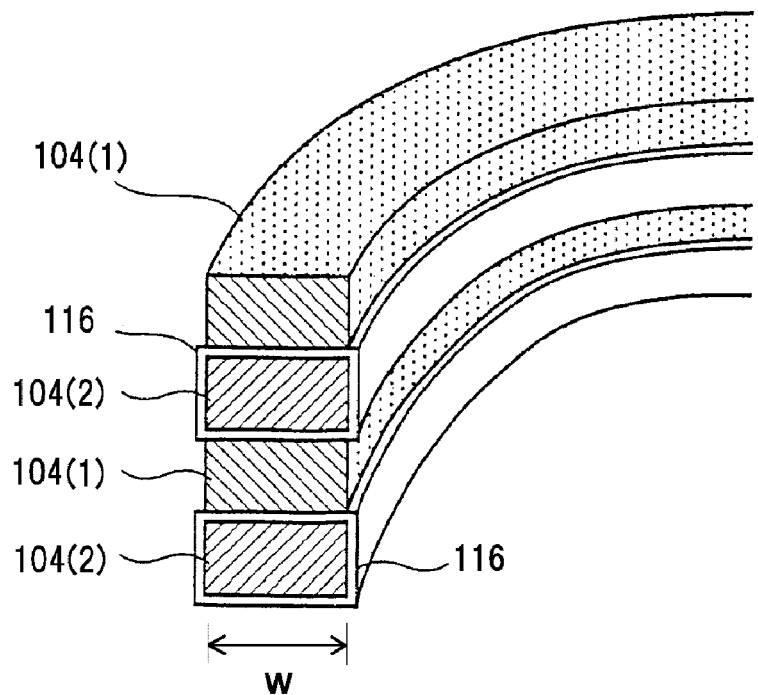
FIG. 7 is a partial cross sectional perspective view illustrating the coil winding structure in accordance with the embodiment of the present disclosure.

Here, the coils 104(1) and 104(2) have a distinguishing coil structure between them. That is, conducting wires of the coils 104(1) and 104(2) are spirally wound around the bobbin 114 along an outer circumferential surface thereof in the same winding lengths such that they are alternated in an axial direction of the bobbin 114, as shown in FIG. 6. Desirably, the conducting wires of the coils 104(1) and 104(2) are made of thin plate-shaped or straight-angled copper wires having the same cross sectional areas, as shown in FIG. 7. To prevent a short circuit between the coils, the conducting wire of one of the air core coils 104(1) and 104(2) (in this example, the coil 104(2)) is covered with an insulation coating, e.g., covered with a tube 116 made of, e.g., Teflon (registered trademark).

Further, as shown in FIG. 4, lower ends (output terminals) of the coils 104(1) and 104(2) are connected to the capacitors 106(1) and 106(2) (see FIG. 2) in the capacitor box 112 via connecting conductors 118(1) and 118(2), respectively.

As described above, the two coils fixed on the single bobbin have the same coil diameter and the same winding length. That is, the conductive wires of the coil 104(1) of the first filter 102(1) and the coil 104(2) of the second filter 102(2) fixed on the bobbin 114 are made of the same material and have the same size (thickness and length). The coils 104(1) and 104(2) have a coil diameter corresponding to an outer diameter of the bobbin 114, and the conductive wires of the coils 104(1) and 104(2) are alternately wound in the axial direction of the bobbin 114.

Meanwhile, distributed constant lines are formed between the coil 104(1) of the first filter 102(1) and the cylindrical outer conductor 110 and between the coil 104(2) of the second filter 102(2) and the cylindrical outer conductor 110 in electrically independent manner (in parallel).

Further, in the filter unit 54(IN) in accordance with this experimental example, the bobbin 114 may not be an essential element. That is, the insulating bobbin 114 does not have any effect on an electric function or an electromagnetic function of the coils 104(1) and 104(2). Accordingly, if the coils 104(1) and 104(2) can be stably supported as one body by an adhesive or any supporting member other than the bobbin 114, the bobbin 114 may be omitted.

Now, a configuration in which distributed constant lines are formed between the coil 104(1) of the first filter 102(1) and the outer conductor 110 and between the coil 104(2) of the second filter 102(2) and the outer conductor 110 will be described.

In general, a characteristic impedance $Z_0$ of a transmission line is represented by '$Z_0=\sqrt{(LC)}$' in case that no loss occurs. Here, C denotes an electrostatic capacitance per unit length, and L denotes an inductance L per unit length. Further, a wavelength λ may be represented by the following Eq. (1)

$$\lambda=2\pi/(\omega\sqrt{(LC)}) \qquad \text{Eq. (1)}$$

In a general distributed constant line (especially, in a coaxial line), a cylindrical rod-shaped conductor may be used as a central conductor, whereas, in the present disclosure, a cylindrical coil is used as a central conductor. It is deemed that the inductance L per unit length is dominantly generated by this cylindrical coil. Further, the electrostatic capacitance per unit length may be defined as an electrostatic capacitance C of a capacitor formed by a coil surface and the outer conductor. Accordingly, in the present disclosure, by using the inductance L per unit length and the electrostatic capacitance C per unit length, a distributed constant line having a characteristic impedance of '$Z_0=\sqrt{(LC)}$' may be provided.

If the filter unit having the aforementioned distributed constant line is viewed from the side of a terminal T, an opposite side of the terminal T is quasi short-circuited by a capacitor having a large capacitance (e.g., about 5000 pF). Thus, a frequency-impedance characteristic featuring repetition of high impedance at a regular frequency interval may be obtained. Such an impedance characteristic may be achieved when a wavelength and a distributed constant line length are same.

In an embodiment of the present disclosure, an overall length s (shown in FIG. 4) of a coil, not a winding length of the coil, becomes a distributed constant line length. Further, by using the coil as the central conductor, L can be set to be much larger than that in case of using the cylindrical rod-shaped central conductor, so that λ can be reduced. Accordingly, an effective length equal to or longer than a wavelength can be obtained by using a short line length (coil length s), and an impedance characteristic featuring repetition of high impedance at a regular frequency interval may be obtained.

Here, on each of the distributed constant lines formed between the coils 104(1) and 104(2) and the outer conductor 110, it may be desirable that a characteristic impedance (particularly, inductance per unit length and capacitance per unit length) is constant. In this experiment example, the requirements for the constant characteristic impedance may be satisfied because the cylindrical coils 104(1) and 104(2) are coaxially arranged within the cylindrical outer conductor 110.

Even in case that there is an irregularity in gaps (distances) between the coils 104(1) and 104(2) and the outer conductor 110, the requirements for the constant characteristic impedance may be satisfied if the irregularity is within a tolerance range (generally, equal to or less than about ¼ of a wavelength of a high frequency power to be blocked).

Figure 8:
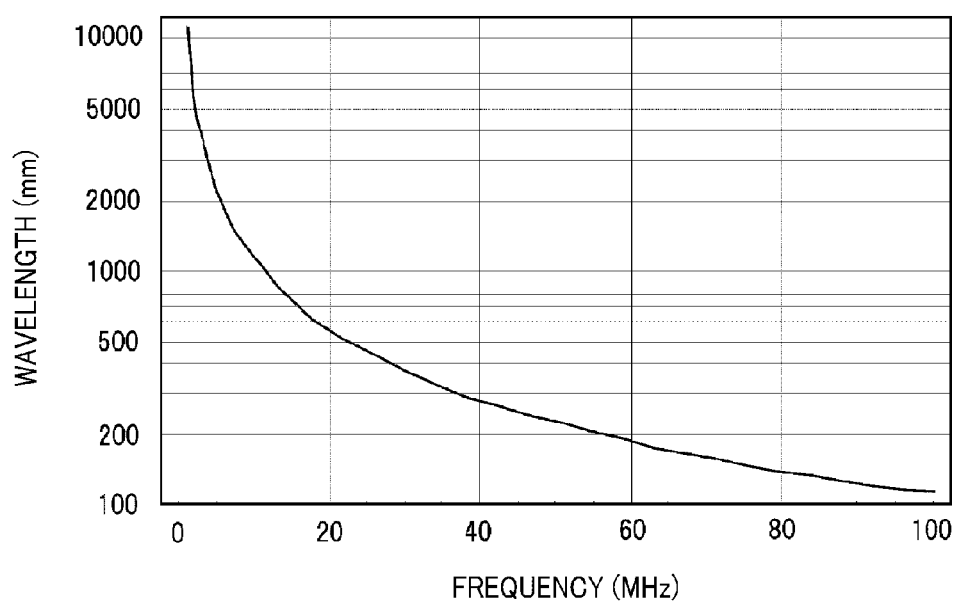
FIG. 8 is a plot diagram showing a relationship between a frequency and a wavelength of a high frequency power on a distributed constant line.

By way of example, as a standard case of the filter unit 54(IN) in accordance with the present experimental example, when the inductance per unit length and the capacitance per unit length are about 40 μH and about 200 pF, respectively, a frequency and a wavelength of a high frequency power on the distributed constant line may have a relationship (characteristic) as depicted in FIG. 8 from the above-specified Eq. (1). In accordance with this characteristic, when the frequency of the high frequency power is, e.g., about 80 MHz, its wavelength may be about 150 mm. Accordingly, as for the gaps (distances) between the coils 104(1) and 104(2) and the outer conductor 110, a difference up to about 37.5 mm may be allowable in an axial direction or a line direction.

With this configuration, in the first filter 102(1), multiple parallel resonances may occur and a filter characteristic featuring a highly stable and reproducible impedance characteristic may be obtained easily.

The present inventors fabricated a plurality of sample filter units 54(IN) in accordance with the present experimental example as shown in FIGS. 4 to 7. Two samples 54(IN)A and 54(IN)B were separately installed in the plasma etching apparatus (shown in FIG. 1) in accordance with the present embodiment. Then, by using a network analyzer, a frequency was varied from about 0 to about 100 MHz, and impedance of a first filter 102(1) viewed from a filter terminal T(1) was measured in each case.

Figure 9:
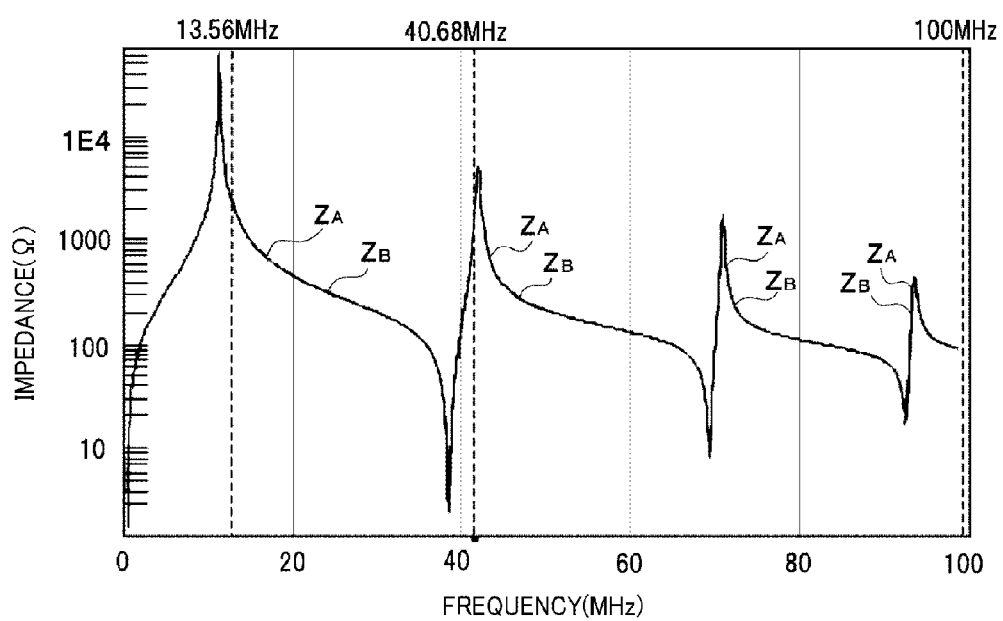
FIG. 9 is a diagram showing an impedance characteristic obtained from two sample products of the filter unit in accordance with the first experimental example.

As the experimental result, impedance characteristics $Z_A$ and $Z_B$ as shown in FIG. 9 were obtained from the samples 54(IN)A and 54(IN)B of the filter unit 54(IN), respectively. As shown in the drawing, the impedance characteristic $Z_A$ of one sample 54(IN)A and the impedance characteristic $Z_B$ of the other sample 54(IN)B are almost completely overlapped to the extent that they are undistinguishable from each other. Further, a multiple parallel resonance characteristic is found to be regular and stabilized, and parallel resonance frequencies of the two samples 54(IN)A and 54(IN)B are found to be substantially same as about 11.31 MHz, about 40.68 MHz, about 70.44 MHz, and about 93.9 MHz. Thus, through this experiment, it was proved that the stability and reproducibility of the impedance characteristic is very high.

Figure 10:
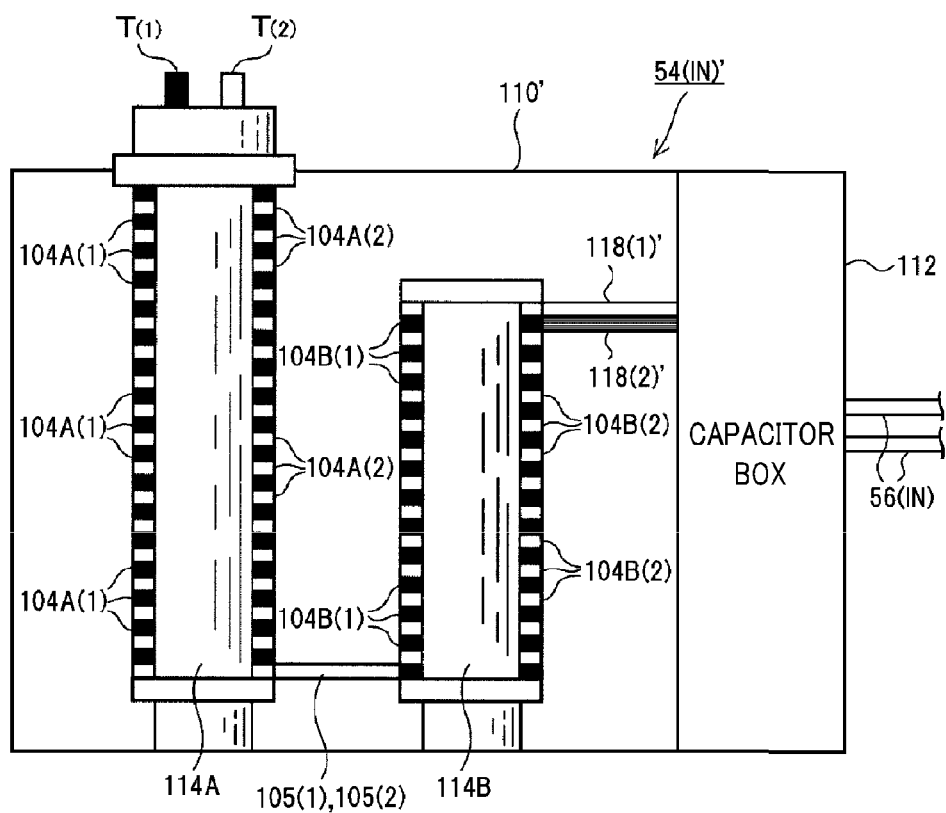
FIG. 10 is a longitudinal cross sectional view illustrating a structure of the filter unit in accordance with a comparative example.

Meanwhile, as a comparative example, the present inventors fabricated a plurality of sample filter units 54(IN)' having the same configuration as that shown in FIG. 10. The filter unit 54(IN)' includes, in a casing 110' made of a conductive plate, a plurality of, e.g., about two air core coils (i.e., a set of 104A(1) and 104B(1) and a set of 104A(2) and 104B(2)) arranged in parallel.

Here, the coils 104A(1) and 104A(2) are spirally wound around a bobbin 114A in the same winding lengths such that they are alternated, and the coils 104B(1) and 104B(2) are spirally wound around a bobbin 114B in the same winding lengths such that they are alternated. The coil 104A(1) of the bobbin 114A and the coil 104B(1) of the bobbin 114B are installed on a part of the first power feed line 100(1) and are electrically connected with each other via a connector conductor 105(1)'. Further, the coil 104A(2) of the bobbin 114A and the coil 104B(2) of the bobbin 114B are installed on a part of the second power feed line 100(2) and are electrically connected with each other via a connector conductor 105(2)'.

Three sample products 54(IN)'C, 54(IN)'D and 54(IN)'E of the filter unit having the same configuration as that shown in FIG. 10 were separately installed in the plasma etching apparatus illustrated in FIG. 1. Then, by using a network analyzer, a frequency was varied in the range of about 0 MHz to about 100 MHz and impedance at each frequency viewed from a filter terminal T(1) was measured for a first filter 102(1)' in each case.

Figure 11:
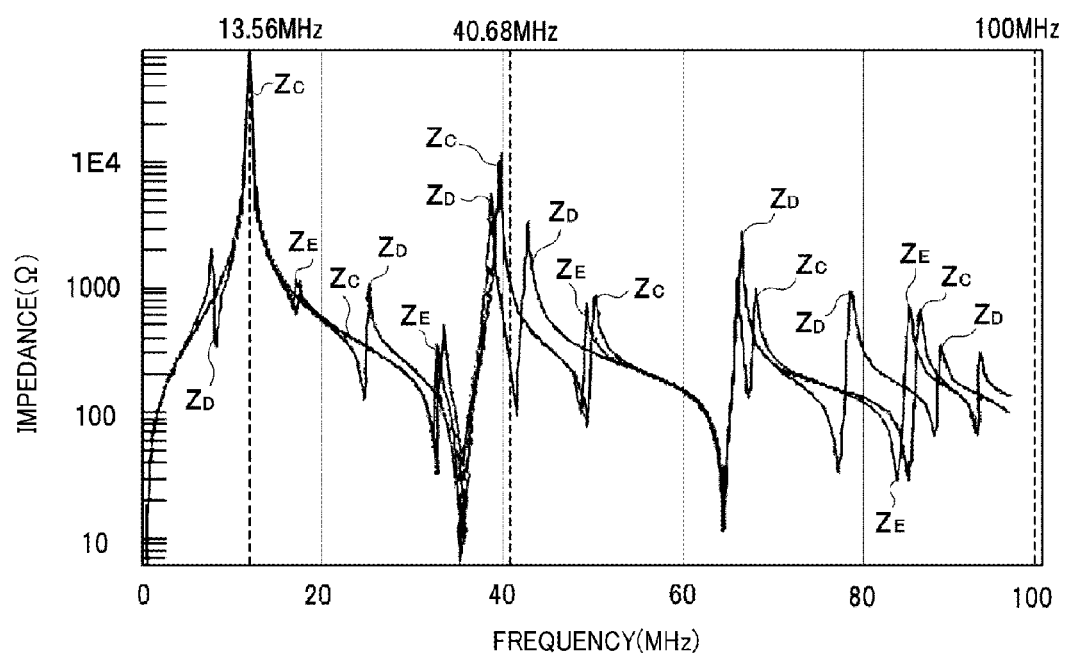
FIG. 11 provides a diagram showing an impedance characteristic obtained from three sample products of the filter unit in accordance with the comparative example.
Figure 12:
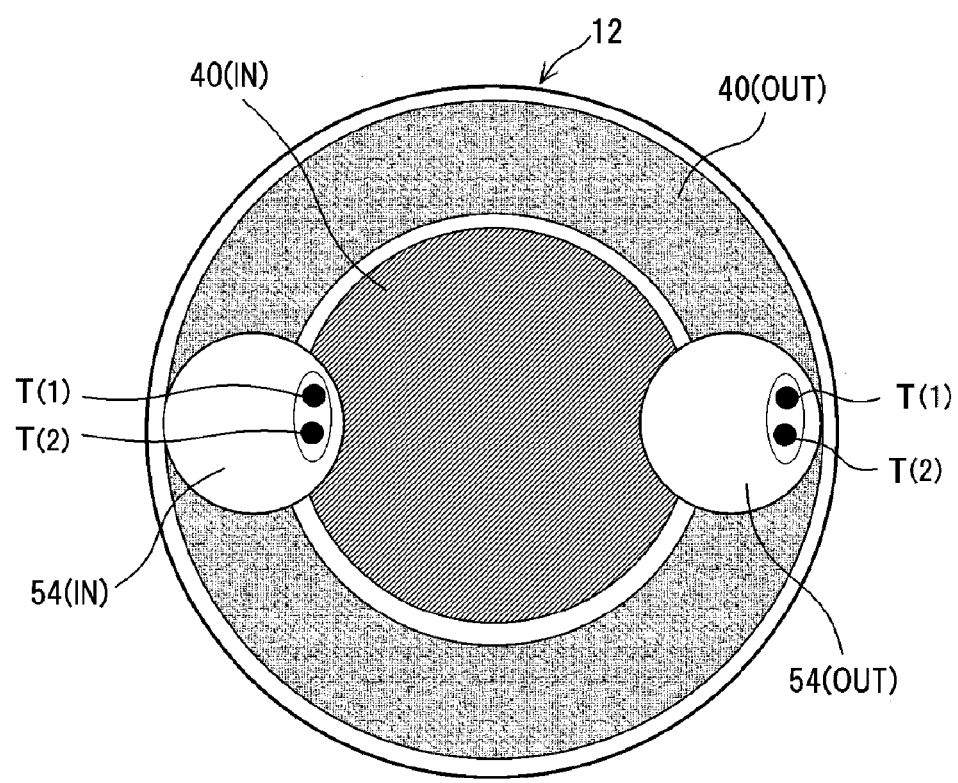
FIG. 12 is a schematic plane view illustrating a layout of the filter unit in accordance with the embodiment of the present disclosure.

As a result, impedance characteristics $Z_C$, $Z_D$ and $Z_E$ as shown in FIG. 11 were obtained from the three sample products 54(IN)'C, 54(IN)'D and 54(IN)'E, respectively. As shown in the drawing, the impedance characteristics $Z_C$, $Z_D$ and $Z_E$ are almost same in a low frequency range equal to or less than about 13.45 MHz, but not in a high frequency range over about 13.45 MHz. Moreover, an abnormal increase or an abnormal decrease in a corn shape, which may be easily confused with parallel resonance, appears irregularly. Thus, the three impedance characteristics $Z_C$, $Z_D$ and $Z_E$ are found to have inferior stability and reproducibility.

By way of example, on the first power feed line 100(1) of the filter unit 54(IN)' in accordance with the comparative example, distributed constant lines are respectively formed between the coil 104A(1) of the bobbin 114A and the casing 110' as an outer conductor and between the coil 104B(1) of the bobbin 114B and the casing 110' as an outer conductor. However, the two coils 104A(1) and 104B(1) are arranged in parallel, and spatial profiles of the distributed constant lines may be varied remarkably in the connector conductor 105(1)' that connects the two coils 104A(1) and 104B(1).

On the second power feed line 100(2), distributed constant lines are also formed between the coil 104A(2) of the bobbin 114A and the casing 110' as the outer conductor and between the coil 104B(2) of the bobbin 114B and the casing 110' as the outer conductor, respectively. However, the two coils 104A(2) and 104B(2) are arranged in parallel, and spatial profiles of the distributed constant lines may be varied remarkably in the connector conductor 105(2)' that connects the two coils 104A(2) and 104B(2).

In case of the filter unit 54(IN)' in accordance with the above-described comparative example, parallel resonance frequencies may have no stability and no regularity, and non-uniformity (fluctuation) may be easily caused between the filter units 54(IN)'C, 54(IN)'D and 54(IN)'E even in case the three filter units have the same configuration and the same specification. Thus, in an impedance characteristic, a high impedance obtained at a peak of a corn shape, which increases due to parallel resonance, may not be used stably and accurately.

As described above, in accordance with the first experimental example, in the filter 102(1) provided on the power feed line 100(1) for supplying a high current from the heater power supply 58(IN) to the heating wire 40(IN) embedded in the susceptor (lower electrode) 12, multiple parallel resonance may occur at multiple regular frequencies, and a filter characteristic featuring a highly stable and reproducible impedance characteristic may be easily achieved.

Therefore, even if a part of high frequency powers HF and LF from the high frequency power supplies 28 and 30 enters the first power feed line 100(1) via the susceptor 12 and the heating line 40(IN), the first filter 102(1) composed of the single coil 104(1) can apply a sufficiently high impedance to any high frequency noise of the two frequency powers based on such a regular multiple parallel resonance characteristic as described above. For example, when a frequency of the second high frequency power LF is set to be about 13.56 MHz and a frequency of the first high frequency power HF is set to be about 80 MHz, a constant high impedance of about 1000Ω or more can be applied to a high frequency noise of the second high frequency power LF (about 13.56 MHz), and a constant high impedance of about 100Ω or more can be applied to a high frequency noise of the first high frequency power HF (about 80 MHz) in accordance with the impedance characteristic shown in FIG. 9. Accordingly, a characteristic for stably blocking a high frequency noise without fluctuation can be obtained.

Further, from a different point of view, since the characteristic for stably blocking the high frequency noise without fluctuation can be obtained, a regular multiple parallel resonance characteristic can be used, and inductance (i.e., length) of an air core coil can be greatly reduced as compared to a case of using a conventional air core coil. Accordingly, unlike in a conventional apparatus in which a plurality of air core coils are provided in a filter unit, only one air core coil may be provided in a filter unit of the plasma processing apparatus in accordance with the present embodiment. Furthermore, although only one air core coil is used, the characteristic for stably blocking the high frequency noise without fluctuation can be effectively achieved as compared to the conventional case of using the plurality of air core coils electrically connected in series.

As described above, the filter 102(1) in accordance with the first experimental example is capable of preventing an invasion of a high frequency noise into the heater power supply 58(IN) effectively and capable of stabilizing plasma generated in the chamber 10 by a high frequency electric discharge, thereby increasing reproducibility and reliability of a plasma process. Further, the second filter 102(2) provided on the second power feed line 100(2) has the same configuration and exhibits the same effects as those of the above-described first filter 102(1).

Further, in the filter 102(1), the capacitor 106(1) connected to an output terminal of the coil 104(1) may become substantially short-circuited within the high frequency range, and an output terminal of the distributed constant line 120(1) may become short-circuited line. Also, the impedance characteristic of the filter 102(1), especially a resonance frequency of multiple parallel resonances can be arbitrarily controlled by changing a winding length (line length) of the coil 104(1). That is, a characteristic of the output terminal short-circuit line in which the frequency of the multiple parallel resonance varies depending on the line length is suitable for the distributed constant line 120(1) of the filter 102(1). Therefore, by setting the winding length of the coil 104(1) to be longer than that of the sample products of the first experimental example, each parallel resonance frequency can be reduced. To the contrary, by setting the winding length of the coil 104(1) to be shorter than that of the sample products of the first experiment example, each parallel resonance frequency can be increased.

Further, the filter unit 54(IN) in accordance with the first experimental example includes all necessary elements (coils 104(1) and 104(2) of the first and second filters 102(1) and 102(2)) in the cylindrical casing 110 as an outer conductor, and so does the other filter unit 54(OUT). Accordingly, in the plasma processing apparatus in accordance with the present embodiment, the two filter units 54(IN) and 54(OUT) can be arranged at a regular distance (angular interval of about 180°) with respect to the inner heating wire 40(IN) and the outer heating wire 40(OUT) within the susceptor 12. Accordingly, unbalanced influence from the filter units 54(IN) and 54(OUT) on an electromagnetic profile (e.g., a plasma density distribution within the chamber 10) within the apparatus can be reduced.

Figure 25:
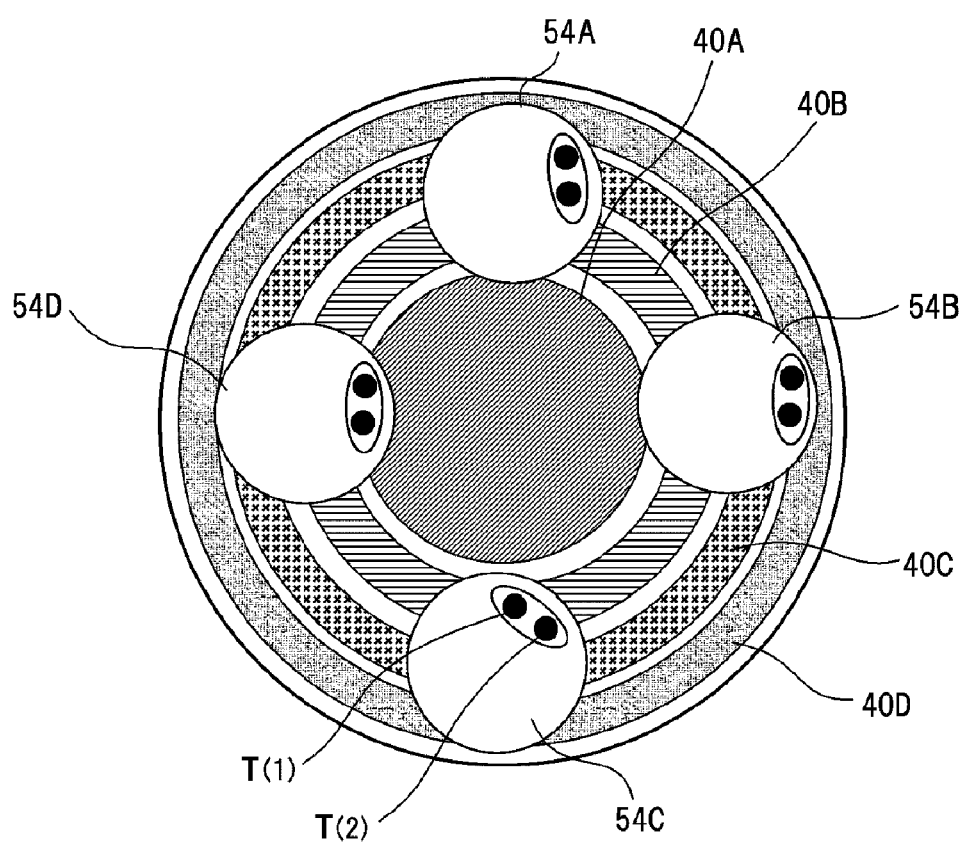
FIG. 25 is a schematic plane view illustrating a layout of a filter unit in accordance with another embodiment of the present disclosure.

In another embodiment, as illustrated in FIG. 25, in case that the heating member 40 is divided into four members 40A, 40B, 40C and 40D in a radial direction, their corresponding filter units 54A, 54B, 54C and 54D may be arranged at a regular distance (angular interval of about 90°). Thus, unbalanced influence due to the filter units can be reduced, as in the above case.

Figure 13:
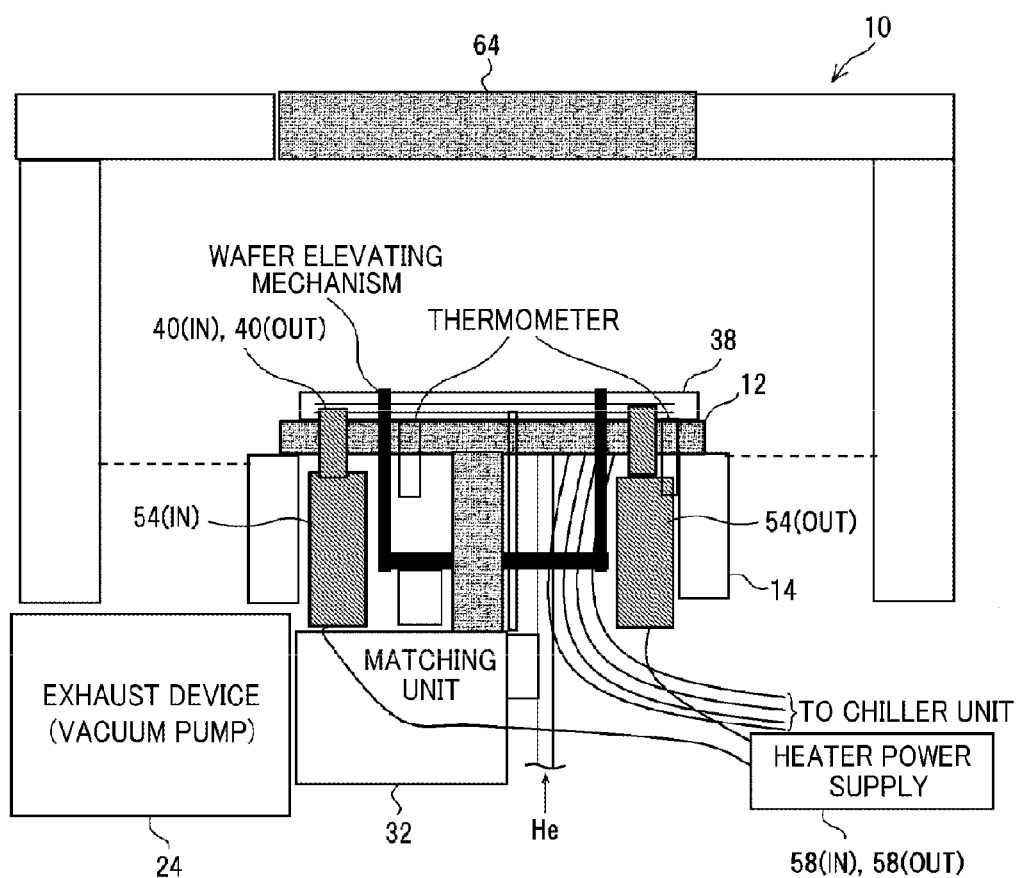
FIG. 13 is a schematic longitudinal cross sectional view illustrating a layout of the filter unit in accordance with the embodiment of the present disclosure.

Furthermore, as depicted in FIG. 13, since occupancy space of the filter units 54(IN) and 54(OUT) are small, degree of freedom in a layout design of other power supply systems or driving systems behind the susceptor 12 can be improved.

Moreover, as shown in FIG. 4, an opening 110a, which is provided in one end surface of the cylindrical outer conductor 110 to allow the filter terminals T(1) and T(2) to pass therethrough, may have a diameter (inner diameter) $J_{110}$ equal to or larger than an outer diameter $J_{104}$ of the coils 104(1) and 104(2), so that an electrostatic capacitance in the vicinity of an entrance, i.e., in the vicinity of the opening 110a may be reduced.

Figure 14:
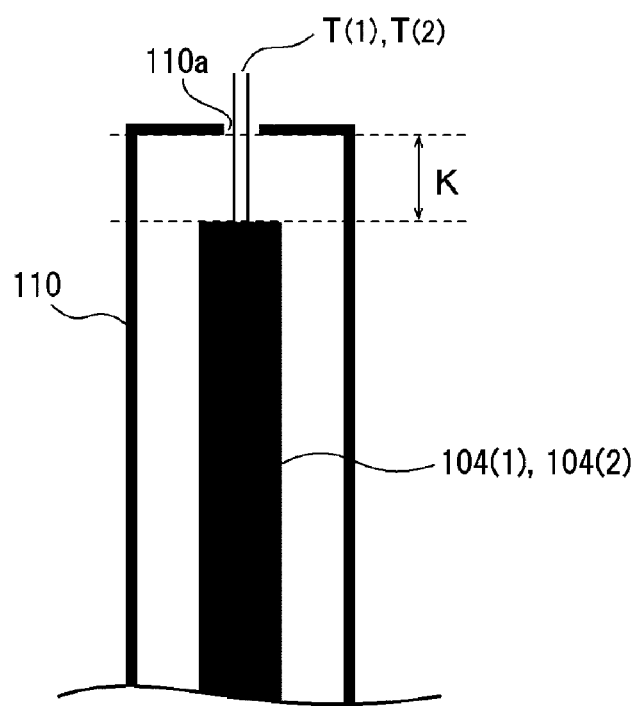
FIG. 14 is a schematic longitudinal cross sectional view illustrating a configuration in the vicinity of an opening of the filter unit in accordance with the first experimental example.

If the diameter $J_{110}$ of the opening 110a is smaller than the outer diameter $J_{104}$ of the coils 104(1) and 104(2), a distance K between the coils 104(1) and 104(2) and the opening 110a in the axial direction needs to be sufficiently large (e.g., about 20 mm or larger), as shown in FIG. 14. As a result, a total length of the filter unit 54(IN) may be increased.

Moreover, the opening 110a is an opening of the outer conductor 110. As illustrated in FIG. 4, if the opening 110a is sealed by a dielectric member 110a such as resin, the presence of the opening 110a may have no electromagnetic effect.

[Second Experimental Example of Filter]

Figure 15:
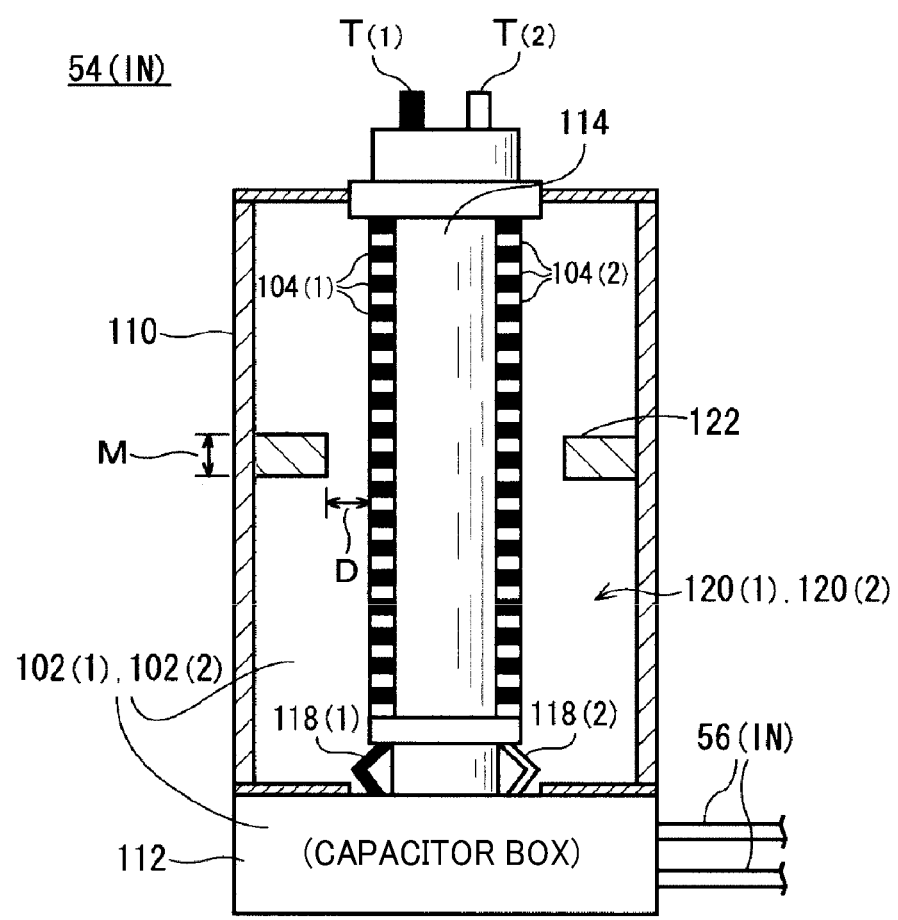
FIG. 15 is a longitudinal cross sectional view illustrating a structure of a filter unit in accordance with a second experimental example.

FIG. 15 illustrates a physical structure of a filter unit 54(IN) in accordance with a second experimental example. An inventive feature of the second experimental example lies in that a parallel resonance frequency controller for adjusting a parallel resonance frequency is further included in a filter unit 54(IN) as used in the first experimental example. In the following second experimental example, a configuration of a first filter 102(1) and an operation of a first distributed constant line 120(1) will be described. A configuration of the second filter 102(2) and an operation of a second distributed constant line 120(2) are completely the same as those of the first filter 102(1) and the first distributed constant line 120(1).

The parallel resonance frequency controller may be configured as a characteristic impedance varying member for partially varying a characteristic impedance of a distributed constant line 120(1) by causing a partial change in the characteristic impedance on a part of a line of the distributed constant line 120(1). Appropriately, a ring member 122 may be coaxially installed between a coil 104(1) and an outer conductor 110, as shown in FIG. 10.

Desirably, the ring member 122 may be configured as a plate body of a circular ring shape on a plane orthogonal to an axial direction of the outer conductor 110, and the ring member 122 may be made of a conductor such as copper, aluminum or the like. The ring member 122 may be electrically connected with the outer conductor 110 and may be electrically insulated from the coil 104(1). Alternatively, the ring member 122 may be electrically connected to the coil 104(1) and may be electrically insulated from the outer conductor 110. Meanwhile, the ring member 122 may be formed of a dielectric material such as resin, and in this case, the ring member 122 may be in contact with both the outer conductor 110 and the coil 104(1). Further, although the ring member 122 may be fixed at a certain position, it may be also desirable to configure the position of the ring member 122 to be variable in an axial direction.

Such a ring-shaped impedance varying member 122 made of a conductor or a dielectric material can partially change a characteristic impedance $\sqrt{(LC)}$ by varying a capacitance C of a coaxial line. When the characteristic impedance is partially changed from $Z_0$ to $Z_1$, reflection may occur at an interface therebetween. Thus, there is provided serially coupled three coaxial lines (length($S_1$)—a characteristic impedance ($Z_0$), length($S_2$)—a characteristic impedance ($Z_1$), and length ($S_3$)—a characteristic impedance ($Z_0$)), thereby having an effect of shifting a frequency of serial/parallel resonance determined by the relationship of frequency, length and wavelength.

A variation caused in a spatial profile of the distributed constant line 120(1) by the ring member 122 is required to be beyond a certain level to achieve an effect of the present disclosure to be described below. That is, it may be desirable that a characteristic impedance $Z_0$ may be varied by about 100 or more.

The present inventors fabricated a sample filter unit 54(IN) having the aforementioned configuration in accordance with the second experimental example shown in FIG. 10. In this sample product, an inner radius of the outer conductor 110 is about 28.125 mm; an outer radius and a length of the coil 104(1) is about 21.25 mm and about 134 mm, respectively; a distance D between the ring member 122 and the coil 104(1) is about 3.75 mm; and a width M of the ring member 122 is about 5 mm. In this sample filter unit 54(IN), an impedance characteristic of the first filter 102(1) viewed from a filter terminal T(1) is obtained by using a network analyzer at each position of the ring member 122 while varying the position of ring member 122 in the axial direction. Frequencies (parallel resonance frequencies) of multiple parallel resonances were measured and plotted, and, thus, an experimental result as shown in FIG. 16 was obtained.

Figure 16:
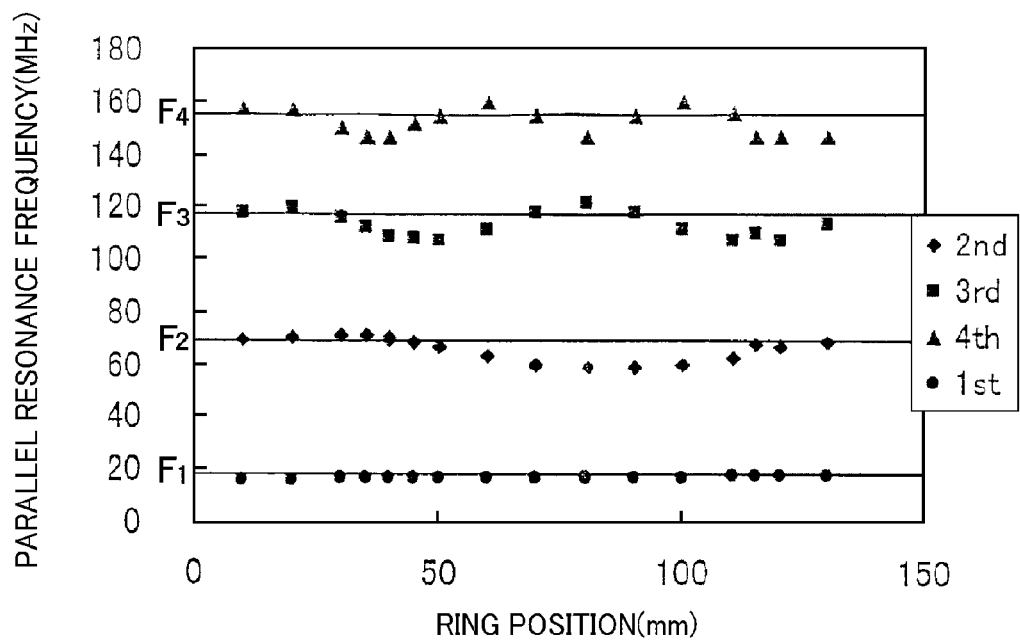
FIG. 16 is a graph plotting respective frequencies of multiple parallel resonances obtained at respective ring positions while varying the position of a ring member in an axial direction in accordance with the second experimental example.

In FIG. 16, parallel resonance frequencies ($F_1$ (about 17.5 MHz), $F_2$ (about 68.75 MHz), $F_3$ (about 116.25 MHz), $F_4$ (about 155.00 MHz)), which do not rely on the position of the ring member, are reference values for comparison obtained from a configuration as shown in FIG. 4 in which the ring member 122 is removed from the filter unit 54(IN) of the second experimental example shown in FIG. 10.

As illustrated in FIG. 16, in accordance with the second experimental example, parallel resonance frequencies are shifted up and down depending on the position (a position of about 10 mm to a position of about 132 mm) of the ring member 122. Here, it should be noted that the respective parallel resonance frequencies are varied (shifted) up and down independently on their own periods.

To be more specific, a first parallel resonance frequency is most greatly shifted at an input terminal side (in the vicinity of a ring member position of about 10 mm) in such a manner as to fall down below a comparison reference value $F_1$, and a shift amount in the vicinity of a central position (in the vicinity of a ring member position of about 75 mm) is about 0. Further, as being closer to an output terminal side, the shift amount increases over the comparison reference value $F_1$. In overall, the shift amount (absolute value) of the first parallel resonance frequency is very small, as compared to shift amounts (absolute values) of other parallel resonance frequencies.

Further, when the ring member 122 is provided at a central position, i.e., in the vicinity of a ½ position (in the vicinity of about 75 mm), a decrement of a second parallel resonance frequency from the comparison reference value $F_2$ becomes maximum.

When the ring member 122 is provided in vicinity of a ½ position (in the vicinity of about 75 mm), an increment of a third parallel resonance frequency becomes maximum. Further, when the ring member 122 is provided in the vicinity of a ⅓ position (in the vicinity of about 45 mm) or in the vicinity of a ⅔ position (in the vicinity of about 120 mm), a decrement thereof becomes maximum.

When the ring member 122 is provided in the vicinity of a ¼ position (in the vicinity of about 30 mm), in the vicinity of a ½ position (in the vicinity of about 75 mm), or in the vicinity of a ¾ position (in the vicinity of about 135 mm), a decrement of a fourth parallel resonance frequency from the comparison reference value $F_4$ becomes maximum. Further, when the ring member 122 is provided in the vicinity of a ⅜ position (in the vicinity of about 60 mm) or in the vicinity of a ⅝ position (in the vicinity of about 100 mm), the increment thereof becomes maximum.

Accordingly, for example, when a frequency of a first high frequency power HF for plasma generation is set to be about 80 MHz, the second parallel resonance frequency may be shifted upward to about 72 MHz to about 75 MHz from the comparison reference value $F_2$ (about 68.75 MHz) by placing the ring member 122 at a position of about 30 mm. As a result, a sufficiently high impedance can be applied to a high frequency noise of about 80 MHz.

Typically, since a frequency of a second high frequency power LF for the ion attraction is limited to about 13.56 MHz or below, the first parallel resonance frequency is first optimized for the frequency of the second high frequency power LF. As described above, the first parallel resonance frequency can be adjusted to a desired low value (e.g., about 12 MHz) by extending the winding length of the coil 104(1). In this case, when any one of the second to fourth parallel resonance frequencies needs to be shifted from the comparison reference value $F_2$, $F_3$, and $F_4$ in order to apply a sufficiently high impedance to the first high frequency power HF for the plasma generation, the ring member 122 may be moved to a optimum position as described above.

In the second experimental example, the ring member 122 of a certain shape, size and material is added to the filter configuration of the first experimental example. In this filter configuration, each parallel resonance frequency of multiple parallel resonances can be adjusted as required, and, further, a filter characteristic featuring a highly stable and reproducible impedance characteristic can be obtained, as in the first experimental example.

[Third Experimental Example of Filter]

Figure 17:
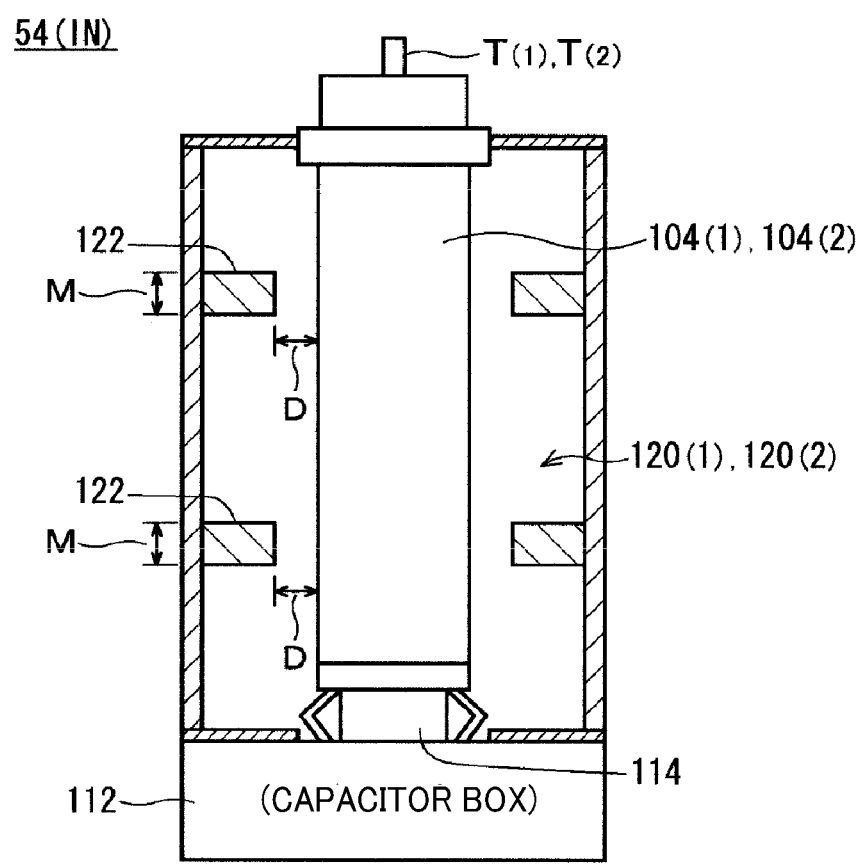
FIG. 17 is a longitudinal cross sectional view illustrating a structure of a filter unit in accordance with a third experimental example.

FIG. 17 illustrates a physical structure of a filter unit 54(IN) in accordance with a third experimental example. The third experimental example is a modification example of the above-described second experimental example, and one filter 102(1) includes a plurality of, e.g., two ring members 122. Although the plurality of ring members 122 and 122 may have different shapes, sizes and materials, it may be typically desirable that they have the same shape, size and material.

The present inventors fabricated the sample filter unit 54(IN) having the aforementioned configuration in accordance with the third experimental example shown in FIG. 17, and an impedance characteristic is measured using a network analyzer as described above, and then the impedance characteristic of the sample product in accordance with third experimental example is compared with that of the sample product in each of the first and second experimental examples.

Figure 18:
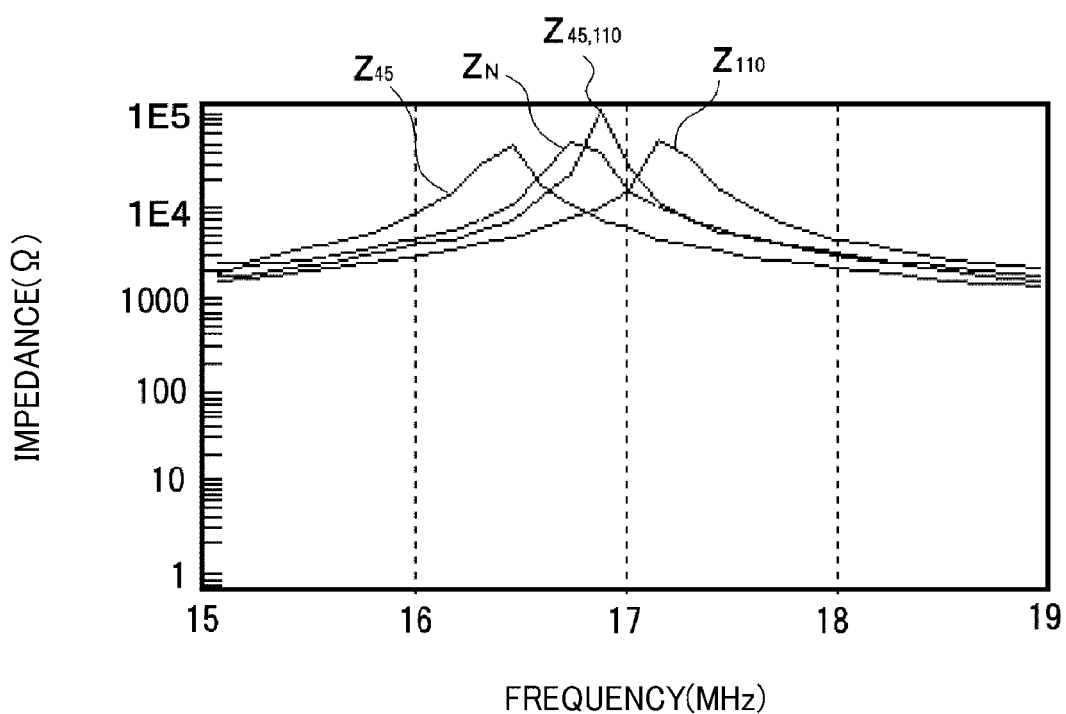
FIG. 18 is a graph showing an impedance characteristic within a relatively low frequency band to investigate an effect of the third experimental example.
Figure 19:
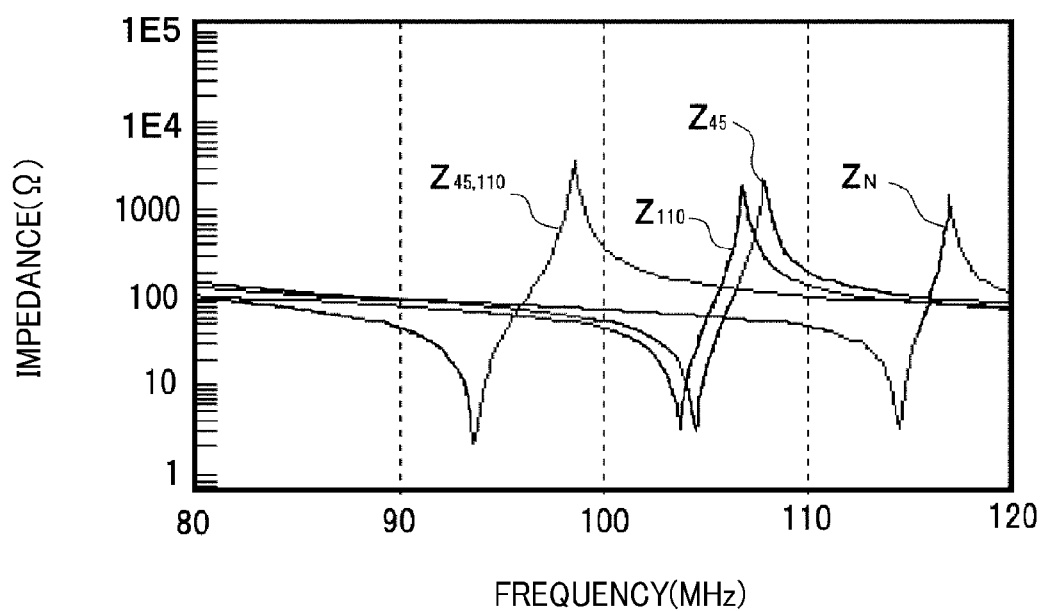
FIG. 19 is a graph showing an impedance characteristic within a relatively high frequency band to investigate an effect of the third experimental example.

FIGS. 18 and 19 provide its experiment result. In the drawings, impedance characteristic $Z_N$ is obtained from the sample product in accordance with the first experimental example shown in FIG. 4 without having the ring member 122 within the filter unit 54(IN). In this impedance characteristic $Z_N$, a first parallel resonance frequency has about 16.8 MHz as shown in FIG. 18, and a third parallel resonance frequency has about 117 MHz as shown in FIG. 19.

In case that one ring member 122 is installed at a position of about 45 mm within the filter unit 54(IN), impedance characteristic $Z_{45}$ is obtained from the sample product in accordance with the second experimental example shown in FIG. 10. In this impedance characteristic $Z_{45}$, the first parallel resonance frequency has about 16.4 MHz as shown in FIG. 18, and the third parallel resonance frequency has about 108 MHz as shown in FIG. 19. This corresponds to the characteristic of FIG. 16. In other words, when the ring position is located at about 45 mm position as shown in FIG. 16, the first parallel resonance frequency is slightly shifted in such a manner as to fall down below a comparison reference value $F_1$, and the third parallel resonance frequency is greatly shifted in such a manner as to fall down below a comparison reference value $F_3$.

In case that one ring member 122 is installed at a position of about 110 mm within the filter unit 54(IN), impedance characteristic $Z_{110}$ is obtained from the sample product in accordance with the second experimental example shown in FIG. 15. In this impedance characteristic $Z_{110}$, the first parallel resonance frequency has about 17.2 MHz as shown in FIG. 18, and the third parallel resonance frequency has about 107 MHz as shown in FIG. 19. This corresponds to the characteristic of FIG. 16. In other words, when the ring position is located at about 110 mm position as shown in FIG. 16, the first parallel resonance frequency is slightly shifted in such a manner as to increase over the comparison reference value $F_1$, and the third parallel resonance frequency is greatly shifted in such a manner as to fall down below a comparison reference value $F_3$.

In case that two ring members 122 and 122 are installed at a position of about 45 mm and about 100 mm respectively within the filter unit 54(IN), impedance characteristic $Z_{45, 110}$ is obtained from the sample product in accordance with the experimental example shown in FIG. 17. In this impedance characteristic $Z_{45, 110}$, the first parallel resonance frequency has about 16.9 MHz as shown in FIG. 13, and the third parallel resonance frequency has about 98 MHz as shown in FIG. 14.

As described above, in accordance with the third experimental example, there can be obtained an effect of combining impedance characteristics and $Z_{45}$ and $Z_{110}$ obtained in the sample filter of the second experimental example shown in FIG. 15 in which one ring member 122 is placed on the position of about 45 mm and the position of about 110 mm. That is, as for the first parallel resonance frequency, a decrement and an increment from the comparison reference value $F_1$ are mutually cancelled as the impedance characteristic $Z_{45}$ and the impedance characteristic $Z_{110}$ are combined. Thus, a value close to the comparison reference value $F_1$ can be obtained Further, for the third parallel resonance frequency, decrements from the comparison reference value $F_3$ are doubled as the impedance characteristic $Z_{45}$ and the impedance characteristic $Z_{110}$ are combined, so that a decrement twice as large as the original decrement can be obtained. Accordingly, a high impedance of about 300Ω or more can be obtained at a frequency of about 100 MHz.

In accordance the third experimental example as described above, to apply a desired high impedance to a frequency (e.g., about 13.56 MHz) of the second high frequency power LF, the first parallel resonance frequency may be optimized by adjusting a winding length of the coil 104(1). Furthermore, by arranging the two ring members 122 at symmetrical positions (e.g., a position of about 45 mm and a position of about 110 mm) with respect to a central ring position (a position of about 75 mm), the third parallel resonance frequency may be greatly shifted in one direction while the first parallel resonance frequency is hardly shifted. Therefore, a sufficiently high impedance can be applied to a frequency, (e.g., about 100 MHz) to be blocked.

In the third experimental example as described above, a plurality of ring members 12 having certain shape, size and material is added to the filter of the first experimental example. In accordance with this third experimental example, a filter characteristic featuring a highly stable and reproducible impedance characteristic can also be obtained as in the first experimental example, and it is possible to adjust each parallel resonance frequency of multiple parallel resonances in a wider frequency range than that in the second experimental example.

[Other Experimental Examples of Filter]

Figure 20:
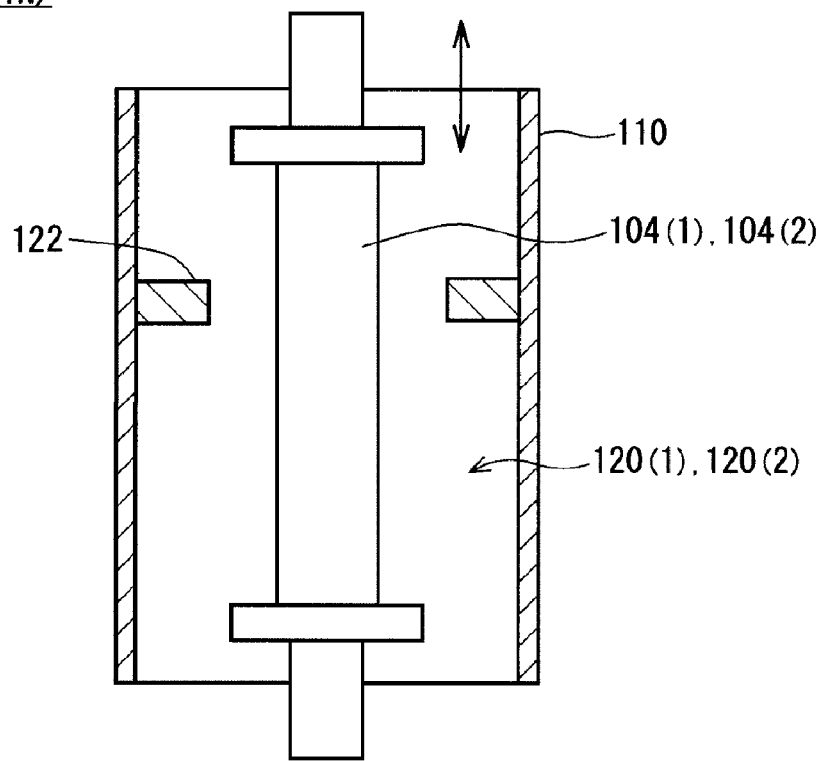
FIG. 20 is a longitudinal cross sectional view illustrating a structure of a filter unit in accordance with another experimental example.
Figure 21:
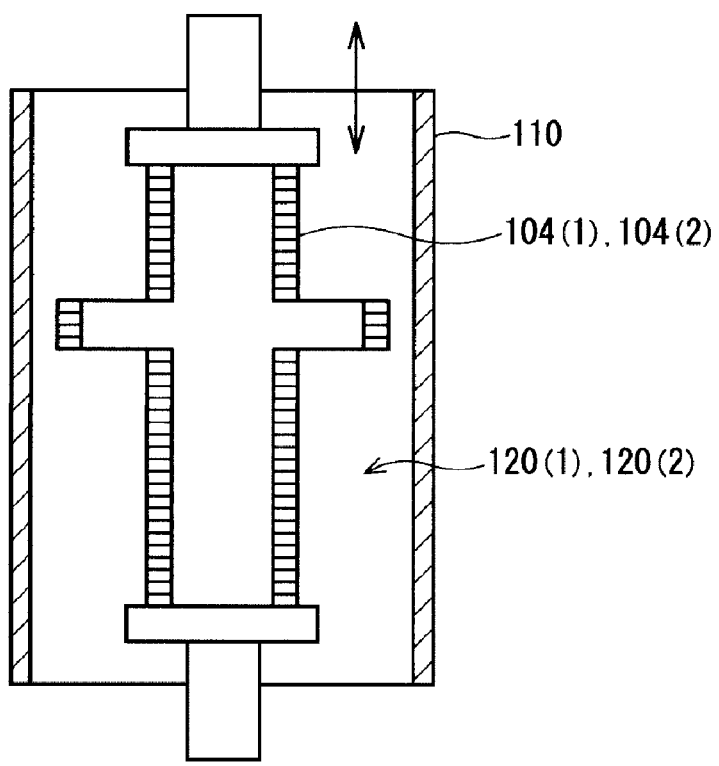
FIG. 21 is a longitudinal cross sectional view illustrating a structure of a filter unit in accordance with still another experimental example.

FIGS. 20 and 21 illustrate other experimental examples of the filter unit 54(IN).

In an experimental example of FIG. 20, a ring member 122 is fixed to an outer conductor 110, and coils 104(1) and 104(2) and the outer conductor 110 are configured to be moved or displaced relative to each other in an axial direction. Further, a position of the ring member 122 can be varied relative to the coil 104(1), 104(2).

In an experimental example of FIG. 21, by locally varying diameters of coils 104(1) and 104(2) at a certain position in an axial direction, a partial change in a characteristic impedance $Z_0$ of distributed constant lines 120(1) and 120(2) may be caused without using a ring member 122. In this experimental example, the coils 104(1) and 104(2) and an outer conductor 110 may configured to be moved or displaced relative to each other.

Figure 22:
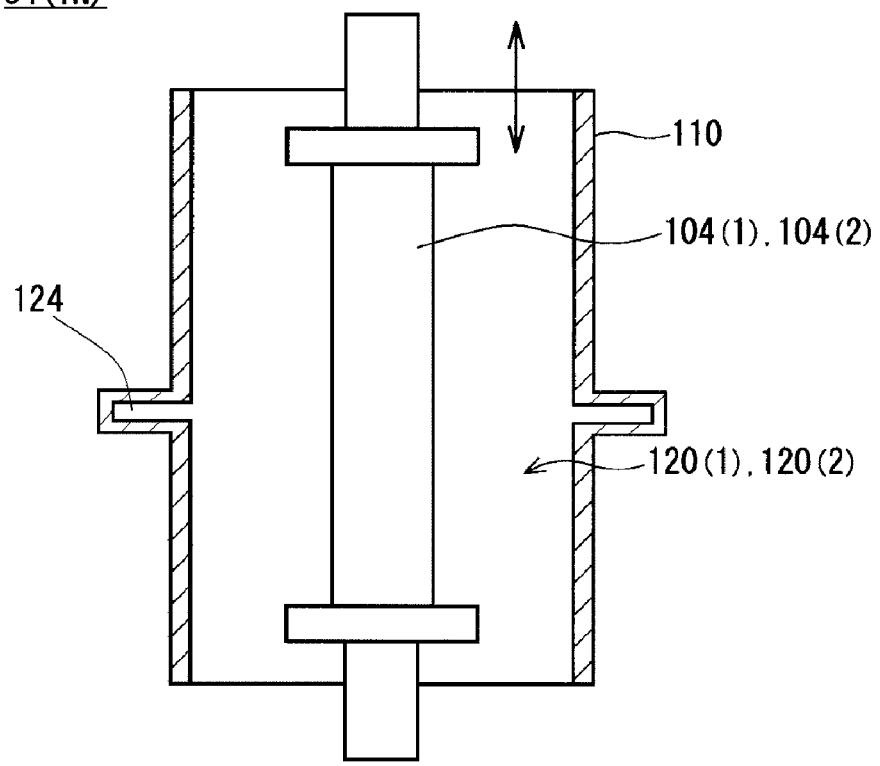
FIG. 22 is a longitudinal cross sectional view illustrating a structure of a filter unit in accordance with still another experimental example.

In an experimental example of FIG. 22, in a filter unit 54(IN), a ring-shaped groove (recess) 124 is formed by locally enlarging a diameter of an outer conductor 110 at a desired position in an axial direction. With this configuration, a partial change can be caused in a characteristic impedance $Z_0$ of distributed constant circuits 120(1) and 120(2) at the position of the ring-shaped groove 124.

In accordance with the experimental example, the conducting wires of the coil 104(1) of the first filter 102(1) and the coil 104(2) of the second filter 102(2) within one outer conductor 110 are spirally wound around the bobbin 114 along an outer circumferential surface thereof in the same winding lengths such that they are alternated. With such a coil winding structure, self-inductances of the two air core coils 104(1) and 104(2) can be made same, and a largest mutual inductance can be obtained. Accordingly, a RF power loss of the filter unit 54(IN) can be reduced, and, besides, a difference in the RF power loss can be reduced.

Although not shown in the drawings, the coil 104(1) of the first filter 102(1) and the coil 104(2) of the second filter 102(2) may be wounded around separate bobbins 114 and coaxially accommodated within different outer conductors 110. Further, as stated above, the bobbin 114 is one of coil supporting members, and the bobbin 114 can be omitted.

In addition, in the cylindrical outer conductor 110 of the filter units 54(IN) and 54(OUT) in accordance with the above experimental example, the cylindrical coils 104(1) and 104(2) are coaxially accommodated, and the distributed constant line 120(1) formed between the coil 104(1) and the outer conductor 110 and the distributed constant line 120(2) formed between the coil 104(2) and the outer conductor 110 are coaxial lines.

However, the distributed constant lines 120(1) and 120(2) may have constant characteristic impedance (particularly, impedance and capacitance), and they need not be coaxial lines as long as the shape and the size of the transversal cross sections of the air core coils and the cylindrical outer conductor are substantially uniform along the distributed constant lines and the gaps between the air core coils and the cylindrical outer conductor are substantially uniform along the distributed constant lines.

Figure 23A:
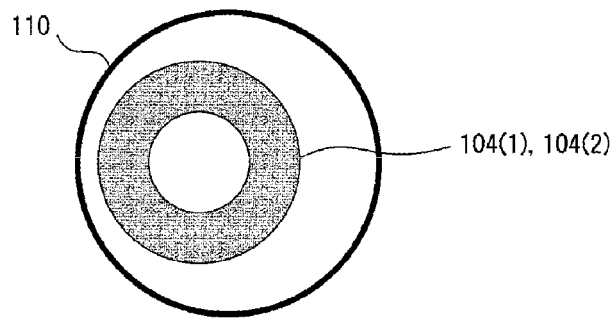
FIG. 23A is a transversal cross sectional view illustrating a filter unit in accordance with still another experimental example.

Accordingly, as illustrated in FIG. 23A, for example, cylindrical coils 104(1) and 104(2) may be accommodated within a cylindrical outer conductor 110 in a non-coaxial manner (eccentrically).

Figure 23B:
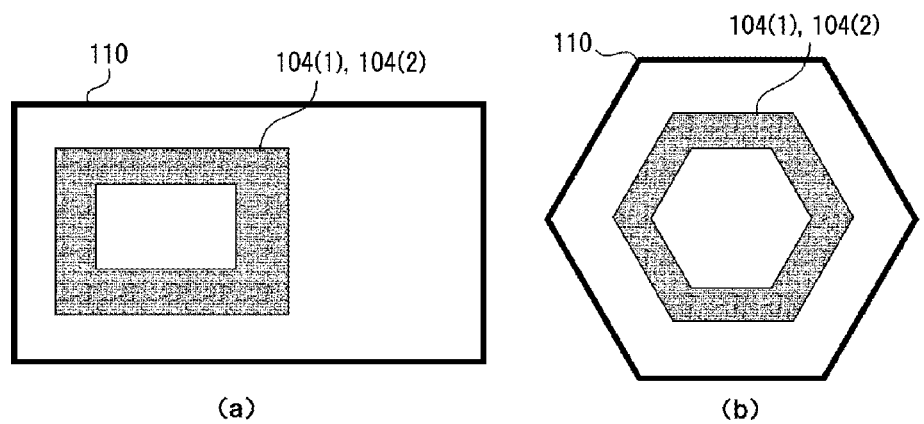
FIG. 23B is a transversal cross sectional view illustrating a filter unit in accordance with still another experimental example.

Alternatively, as illustrated in (a) of FIG. 23B, rectangular tube-shaped coils 104(1) and 104(2) having a rectangular transversal cross section may be coaxially (or non-coaxially) accommodated within a rectangular tube-shaped outer conductor 110 having a rectangular transversal cross section. Still alternatively, as depicted in (b) of FIG. 23B, hexagonal tube-shaped coils 104(1) and 104(2) having a hexagonal transversal cross section may be coaxially (or non-coaxially) accommodated within a hexagonal tube-shaped outer conductor 110 having a hexagonal transversal cross section.

Figure 23C:
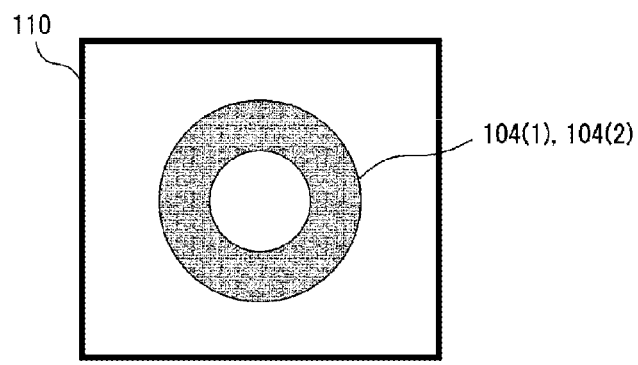
FIG. 23C is a transversal cross sectional view illustrating a filter unit in accordance with still another experimental example.

Alternatively, as illustrated in FIG. 23C, cylindrical coils 104(1) and 104(2) having a circular transversal cross section may be coaxially (or non-coaxially) accommodated within a rectangular tube-shaped outer conductor 110 having a rectangular transversal cross section.

[Experimental Example of Power Feed Rod]

The high frequency filter technique in accordance with the present disclosure using a multiple parallel resonance characteristic of a distributed constant line is also applicable to high frequency power feed lines 34 and 35 through which the matching unit 32 is electrically connected with the susceptor (lower electrode) 12 in the plasma etching apparatus shown in FIG. 1 in accordance with the above-described embodiment.

Figure 24:
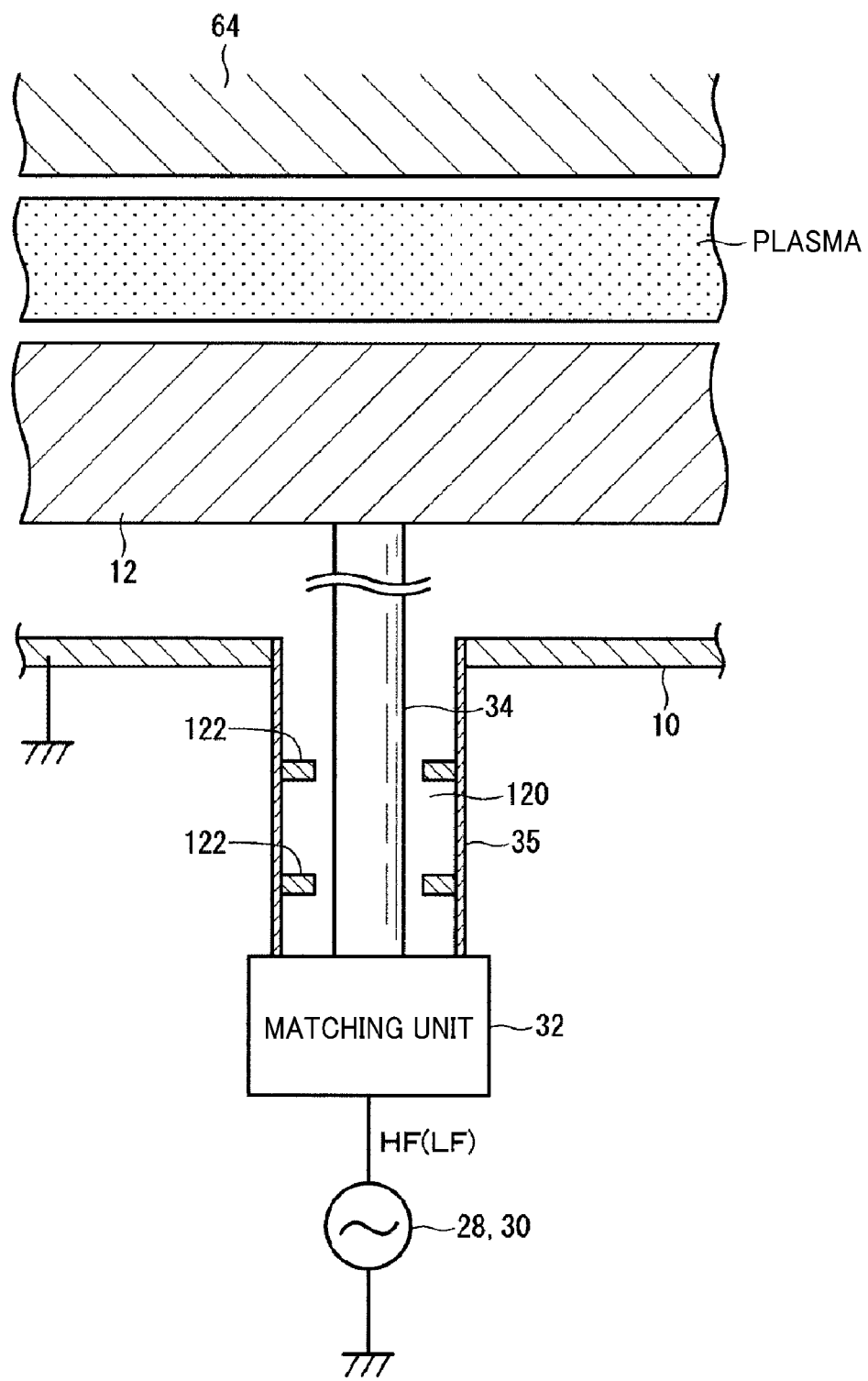
FIG. 24 illustrates an experimental example in which the present disclosure is applied to a high frequency power feed line.

The high frequency power feed line 34 may serve as a power feed rod 34 as an inner conductor and the high frequency power feed line 35 may serve as a conductor cover as an outer conductor, and they form a distributed constant line on a coaxial line in pair. For example, as shown in FIG. 24, one or more ring members 122 may be provided on an inner wall of the conductor cover 35 at a preset position in an axial direction. In this case, the function of the ring member 122 is to efficiently send high frequency powers HF and RF from the matching unit 32 to the susceptor 12 or a plasma load with little loss and to efficiently block a harmonic wave generated from plasma or a harmonic wave caused by inter-modulation distortion when such a harmonic wave enters the high frequency power supply lines 34 and 35.

[Other Embodiments]

The aforementioned embodiment has been described for the case of applying a filter in accordance with the present disclosure to the capacitively coupled plasma etching apparatus of the lower electrode dual frequency application type that applies the first high frequency power HF for plasma generation and the second high frequency power RF for ion attraction to the susceptor 12 within the chamber 10 in order to attenuate noises of both high frequency powers on a pair of heater power feed lines 100(1) and 100(2) for electrically connecting the heating member 40 embedded in the susceptor 12 and the heater power 58 installed outside the chamber 10.

However, the filter in accordance with the above-described embodiment may be also applicable to a capacitively coupled plasma etching apparatus of a type that applies a first high frequency power HF for plasma generation to the upper electrode 64 and applies a second high frequency power RF for ion attraction to the susceptor or may be applicable to a capacitively coupled plasma processing apparatus of a type that applies a single high frequency power to the susceptor 12.

In addition, the present disclosure is not limited to a filter for a power line such as a heater power feed line but may be applicable to any kind of filter installed on a pair of lines or a single line that connects a certain electric member within a chamber with an external circuit of a power system or a signal system installed outside the chamber. A high frequency noise to be blocked by the filter may not be limited to a noise of a high frequency power used in a plasma process as described above, but it may be a harmonic wave generated from plasma or a harmonic wave caused by inter-modulation distortion.

The present disclosure may be applicable to a microwave plasma etching apparatus, an inductively coupled plasma etching apparatus, a helicon wave plasma etching apparatus or the like without being limited to a capacitively coupled plasma etching apparatus. Further, the present disclosure is also applicable to other types of plasma processing apparatuses such as a plasma CVD apparatus, a plasma oxidation apparatus, a plasma nitridation apparatus and a sputtering apparatus. In addition, a processing target substrate used in the present disclosure is not limited to a semiconductor wafer, but various kinds of substrates for a flat panel display, a photo mask, a CD substrate, and a print substrate may be used.

What is claimed is:

1. A plasma processing apparatus comprising:
    a processing chamber that performs a plasma process therein;
    a first electrode installed within the processing chamber and having therein a heating member;
    a second electrode installed within the processing chamber so as to face the first electrode;
    a first high frequency power supply electrically connected with the first electrode;
    a second high frequency power supply electrically connected with the first electrode or the second electrode; and
    a filter that is installed on a power feed line for electrically connecting the heating member with a heater power supply and simultaneously attenuates or blocks a first high frequency noise and a second high frequency noise entering the power feed line via the heating member,
    wherein the filter includes:
    a coil that forms a part of the power feed line, the coil being a central conductor;
    a capacitor connected between an output terminal of the heater power supply of the coil and a conductive member of a ground potential; and a tube-shaped outer conductor that accommodates or surrounds the coil without accommodating or surrounding the capacitor and forms a distributed constant line having a constant characteristic impedance in pair with the coil, further wherein parallel resonance occurs in the distributed constant line at regular multiple resonance frequencies, and said regular multiple resonance frequencies are determined by a winding length of the coil, the winding length of the coil is set such that two of the multiple resonance frequencies are equal to or approximate to a first frequency of the first high frequency noise and a second frequency of the second high frequency noise respectively, so that the distributed constant line provides impedances obtained at local peaks of an impedance characteristic curve, which increase due to parallel resonance for the first and second high frequency noises, and the second frequency is different from the first frequency.

2. The plasma processing apparatus of claim 1, wherein the filter is provided behind the first electrode when viewed from a processing space within the processing chamber.

3. The plasma processing apparatus of claim 1, wherein the heating member is plural in number, the filter corresponding to the heating member is also plural in number, the plural heating members are arranged in parallel, and the plural filters respectively corresponding to the plural heating members are arranged at a regular angular interval.

4. The plasma processing apparatus of claim 1, wherein shapes and sizes of transversal cross sections of the coil and the tube-shaped outer conductor are substantially uniform along the distributed constant line.

5. The plasma processing apparatus of claim 1, wherein a gap between the coil and the tube-shaped outer conductor is substantially uniform along the distributed constant line.

6. The plasma processing apparatus of claim 1, wherein an irregularity larger than about ¼ of a wavelength of the high frequency noise does not exist in a space between the coil and the tube-shaped outer conductor along the distributed constant line.

7. The plasma processing apparatus of claim 1, wherein the power feed line includes a first power conducting wire and a second power conducting wire coupled to both ends of the heating member, respectively, the coil includes a first coil that forms a part of the first power conducting wire and a second coil that forms a part of the second power conducting wire, and inside the outer conductor, a first coil conducting wire that forms the first coil and a second coil conducting wire that forms the second coil are alternately wound in a spiral shape in approximately same winding lengths.

8. The plasma processing apparatus of claim 7, wherein the first coil conducting wire and the second coil conducting wire are formed of plate-shaped wires, and one of the first coil conducting wire and the second coil conducting wire is coated with an insulating material.

* * * * *